US010102911B2

(12) United States Patent
Kasai et al.

(10) Patent No.: US 10,102,911 B2
(45) Date of Patent: Oct. 16, 2018

(54) NON-VOLATILE SEMICONDUCTOR STORAGE DEVICE FOR REDUCING THE NUMBER OF MEMORY CELLS ARRANGED ALONG A CONTROL TO WHICH A MEMORY GATE VOLTAGE IS APPLIED

(71) Applicant: Floadia Corporation, Kodaira-shi, Tokyo (JP)

(72) Inventors: Hideo Kasai, Kodaira (JP); Yasuhiro Taniguchi, Kodaira (JP); Yutaka Shinagawa, Kodaira (JP); Ryotaro Sakurai, Kodaira (JP); Yasuhiko Kawashima, Kodaira (JP); Kosuke Okuyama, Kodaira (JP)

(73) Assignee: FLOADIA CORPORATION, Tokyo (JP)

( * ) Notice: Subject to any disclaimer, the term of this patent is extended or adjusted under 35 U.S.C. 154(b) by 0 days.

(21) Appl. No.: 15/536,167

(22) PCT Filed: Dec. 11, 2015

(86) PCT No.: PCT/JP2015/084816
§ 371 (c)(1),
(2) Date: Jun. 15, 2017

(87) PCT Pub. No.: WO2016/098706
PCT Pub. Date: Jun. 23, 2016

(65) Prior Publication Data
US 2017/0352425 A1     Dec. 7, 2017

(30) Foreign Application Priority Data

Dec. 15, 2014  (JP) .................................. 2014-253463

(51) Int. Cl.
*G11C 16/06* (2006.01)
*G11C 16/10* (2006.01)
(Continued)

(52) U.S. Cl.
CPC ............ *G11C 16/102* (2013.01); *G11C 5/025* (2013.01); *G11C 8/14* (2013.01); *G11C 16/04* (2013.01);
(Continued)

(58) Field of Classification Search
CPC ..................................................... G11C 16/102
(Continued)

(56) References Cited

U.S. PATENT DOCUMENTS

| 6,107,659 A * | 8/2000 | Onakado ................ G11C 16/26 257/318 |
| 2006/0268653 A1 * | 11/2006 | Umezawa ................ G11C 8/10 365/230.06 |
| 2013/0341729 A1 * | 12/2013 | Hisamoto ........... H01L 21/8249 257/378 |

FOREIGN PATENT DOCUMENTS

| JP | 2002-368143 A | 12/2002 |
| JP | 2006-331501 A | 12/2006 |
| JP | 2014-010866 A | 1/2014 |

OTHER PUBLICATIONS

International Search Report and Written Opinion from Corresponding Application No. PCT/JP2015/084816; dated Feb. 4, 2016.

* cited by examiner

*Primary Examiner* — Hoai V Ho
(74) *Attorney, Agent, or Firm* — Pearne & Gordon LLP

(57) ABSTRACT

A non-volatile semiconductor memory device in which, while voltage from a first control line is applied, as a memory gate voltage, to a sub control line through a switching transistor, another switching transistor can block voltage application to a corresponding sub control line. Thus, while a plurality of memory cells are arranged in one direction along the first control line, the number of memory cells to which a memory gate voltage is applied can reduced by the switching transistor, which reduces the occurrence of disturbance, accordingly. The sub control line to which the memory gate voltage is applied from the first control line is used as the gates of memory transistors, and thus the sub control line and the gates are disposed in a single wiring (Continued)

layer, thereby achieving downsizing as compared to a case in which the sub control line and the gates are disposed in separate wiring layers.

10 Claims, 16 Drawing Sheets

(51) Int. Cl.
    *G11C 16/04*     (2006.01)
    *H01L 27/115*     (2017.01)
    *G11C 16/24*     (2006.01)
    *G11C 16/26*     (2006.01)
    *G11C 16/34*     (2006.01)
    *G11C 5/02*     (2006.01)
    *G11C 8/14*     (2006.01)
    *H01L 21/8249*     (2006.01)
    *H01L 27/11526*     (2017.01)
    *H01L 27/11573*     (2017.01)

(52) U.S. Cl.
    CPC .......... *G11C 16/0466* (2013.01); *G11C 16/10* (2013.01); *G11C 16/24* (2013.01); *G11C 16/26* (2013.01); *G11C 16/3427* (2013.01); *G11C 16/3431* (2013.01); *H01L 21/8249* (2013.01); *H01L 27/115* (2013.01); *H01L 27/11526* (2013.01); *H01L 27/11573* (2013.01); *G11C 2216/02* (2013.01)

(58) Field of Classification Search
    USPC ................................................... 365/185.23
    See application file for complete search history.

NON-VOLATILE SEMICONDUCTOR STORAGE DEVICE FOR REDUCING THE NUMBER OF MEMORY CELLS ARRANGED ALONG A CONTROL TO WHICH A MEMORY GATE VOLTAGE IS APPLIED

TECHNICAL FIELD

The present invention relates to a non-volatile semiconductor memory device.

BACKGROUND ART

Japanese Patent Laid-open No. 2002-368143 (Patent Literature 1) discloses a non-volatile semiconductor memory device including a plurality of memory cells arranged in a matrix of rows and columns. In the non-volatile semiconductor memory device disclosed in Patent Literature 1, the memory cells arranged in the matrix each include a memory transistor including a charge storage layer made of a nitride film or polysilicon, and a bipolar switch transistor. This non-volatile semiconductor memory device includes, for example, a plurality of EEPROM word lines EEWL extending in the row direction and a plurality of data lines DL and source lines SL extending in the column direction. Memory cells are provided at intersections between the EEPROM word lines EEWL in the row direction and the data lines DL and the source lines SL in the column direction.

The switch transistor of each memory cell has a base connected with the source of the memory transistor. The memory transistor has a gate connected with one of the EEPROM word lines EEWL, and a drain connected with one of the data lines DL to receive voltage from the EEPROM word line EEWL and the data line DL. The switch transistor has an emitter connected with one of the source lines SL, and a collector provided as a well of the memory transistor.

When data is to be programmed into a memory cell in the non-volatile semiconductor memory device, voltage is applied to the EEPROM word line EEWL, the data line DL, and the source line SL connected with the memory cell so that charge is injected into the charge storage layer through the source of the memory transistor by a voltage difference between the gate and source of the memory transistor of the memory cell, thereby achieving a data programmed state.

CITATION LIST

Patent Literature

Patent Literature 1: Japanese Patent Laid-open No. 2002-368143

SUMMARY OF INVENTION

Technical Problem

In the non-volatile semiconductor memory device having such a configuration, one of the EEPROM word lines EEWL extending in the row direction is also connected with a memory cell on another column. Thus, at data programming, a charge storage memory gate voltage applied to a memory cell into which data is programmed from the EEPROM word line EEWL is also applied to any other memory cell that is connected with the same EEPROM word line EEWL but into which no data is to be programmed.

In this case, no data is programmed into any other memory cell into which no data is to be programmed, but a large charge storage memory gate voltage is applied to the memory cell from the EEPROM word line EEWL, which causes a voltage difference in the memory transistor. Thus, when a plurality of memory cells are arranged in one direction along the EEPROM word line EEWL, repetition of data programming operation on a memory cell sharing the EEPROM word line EEWL causes repeated application of the charge storage memory gate voltage through the EEPROM word line EEWL to any other memory cell into which no data is to be programmed. Accordingly, in the memory cell into which no data is to be programmed, unwanted charge is stored in the charge storage layer due to the voltage difference repeatedly occurring at the memory transistor, which potentially causes a phenomenon (hereinafter referred to as disturbance) that involves change in a threshold voltage eventually.

Moreover, since downsizing has been recently required on an electronic device provided with such a non-volatile semiconductor memory device, it is important to achieve downsizing of the non-volatile semiconductor memory device itself. Thus, it has been desired to provide a non-volatile semiconductor memory device capable of reducing the occurrence of disturbance as described above and achieving downsizing.

The present invention has been made under such circumstances and aims at providing a non-volatile semiconductor memory device that includes a plurality of memory cells arranged in one direction like conventional cases and is capable of reducing the occurrence of disturbance as compared to conventional cases and achieving downsizing.

Solution to Problem

In order to solve the above-described problems, a non-volatile semiconductor memory device according to the present invention includes: a first control line; a plurality of second control lines intersecting with the first control line; a plurality of switching mechanisms disposed at intersections between the first control line and the second control lines, respectively; sub control lines, each of the sub control lines being provided for each switching mechanism; a plurality of memory cells provided for each sub control line, each of the memory cells representing a data programming state depending on a state of charge storage in a charge storage layer provided in a memory transistor. Each sub control line is disposed facing to the charge storage layer of the memory transistor provided for the sub control line and is provided as a gate of the memory transistor. When data is programmed into any of the memory cells, voltage applied to the first control line or the second control line is applied, as a memory gate voltage, to the sub control line provided with the memory cell into which data is to be programmed, through the switching mechanism corresponding to the sub control line, and voltage application from the first control line or the second control line to the other sub control lines provided with the memory cells into which data is not programmed is blocked by the switching mechanisms corresponding to the other sub control lines.

Advantageous Effects of Invention

According to the present invention, while voltage from a first control line or a second control line is applied, as a memory gate voltage, to a sub control line through a switching mechanism, another switching mechanism can block voltage application to a corresponding sub control line. Thus, while a plurality of memory cells are arranged in one direction along the first control line, the number of memory cells to which the memory gate voltage is applied can be reduced by the switching mechanism, thereby reducing the occurrence of disturbance accordingly. The sub control line to which the memory gate voltage is applied from the first control line or the second control line are used as the gates of memory transistors, and thus the sub control line and the gates are disposed in a single wiring layer, thereby achieving downsizing as compared to a case in which the sub control line and the gates are disposed in separate wiring layers.

BRIEF DESCRIPTION OF DRAWINGS

FIG. 5 is a schematic diagram for description of a case in which all switch transistors in a memory unit including a programming memory cell are turned on.

DESCRIPTION OF EMBODIMENTS

Figure 1:
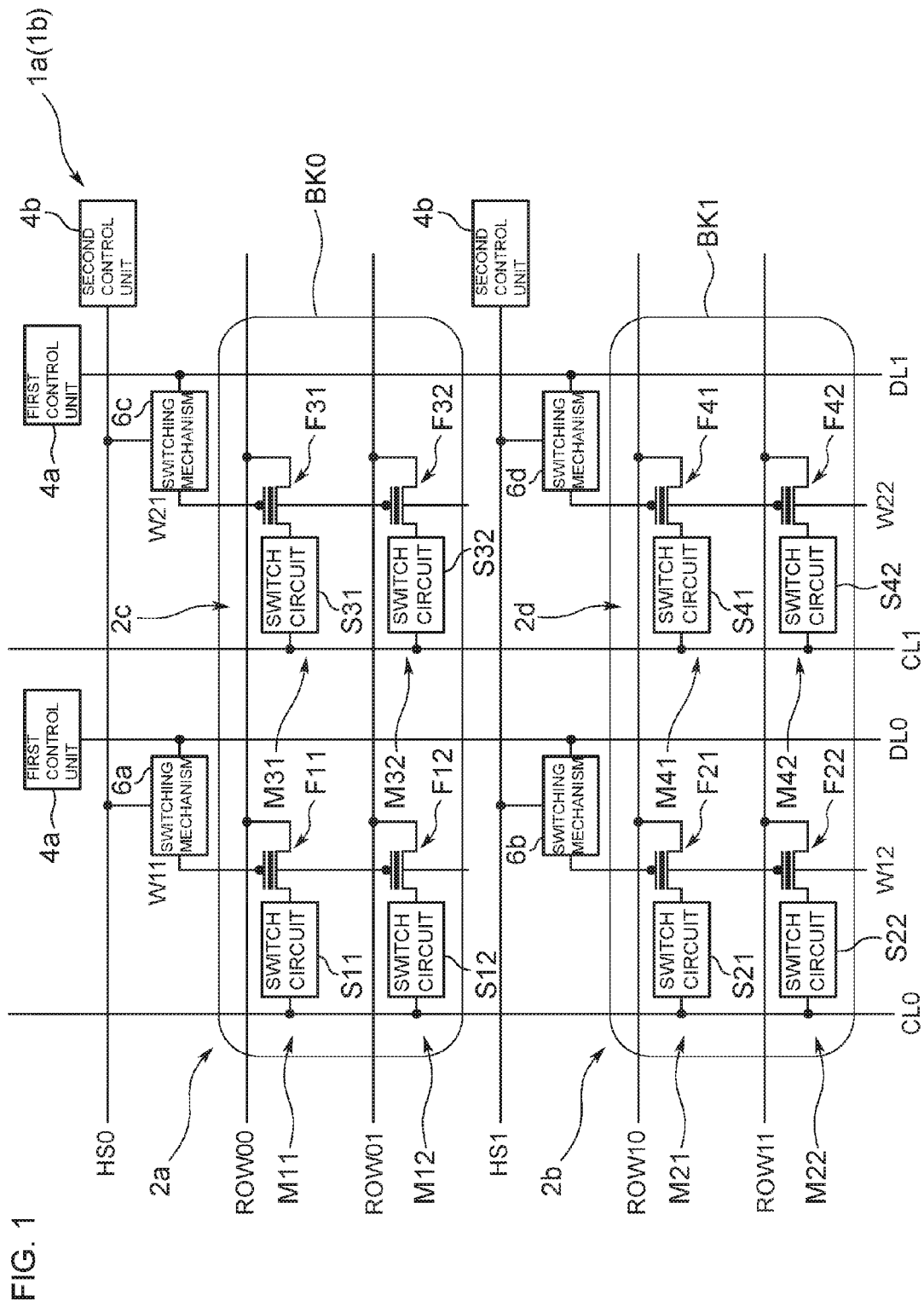
FIG. 1 is a schematic view illustrating a circuit configuration of a non-volatile semiconductor memory device according to the present invention.

Hereinafter, embodiments of the present invention will be described in the following order.
1. Basic configuration of the present invention
1-1. Non-volatile semiconductor memory device in which memory gate voltage is applied to first control line and switching gate voltage is applied to second control line
1-2. Non-volatile semiconductor memory device in which switching gate voltage is applied to first control line and memory gate voltage is applied to second control line
2. Non-volatile semiconductor memory device according to first embodiment
2-1. Data programming operation
2-2. Data reading operation
2-3. Data erasing operation
2-4. Operations and effects
3. Non-volatile semiconductor memory device according to second embodiment
3-1. Data programming operation
3-2. Data reading operation
3-3. Data erasing operation
3-4. Operations and effects
4. Non-volatile semiconductor memory device according to third embodiment
4-1. Data programming operation
4-2. Data reading operation
4-3. Data erasing operation
4-4. Operations and effects
5. Other embodiments (1) Basic Configuration of the Present Invention (1-1) Non-Volatile Semiconductor Memory Device in which Memory Gate Voltage is Applied to First Control Line and Switching Gate Voltage is Applied to Second Control Line In FIG. 1, 1a denotes a non-volatile semiconductor memory device according to the present invention including, for example, a plurality of first control lines DL0 and DL1 disposed side by side and a plurality of second control lines HS0 and HS1 intersecting with the first control lines DL0 and DL1. The non-volatile semiconductor memory device 1a also includes switching mechanisms 6a, 6b, 6c, and 6d at intersections between the first control lines DL0 and DL1 and the second control lines HS0 and HS1. Memory units 2a, 2b, 2c, and 2d are provided for the switching mechanisms 6a, 6b, 6c, and 6d, respectively.

In the non-volatile semiconductor memory device 1a according to the present embodiment, the four memory units 2a, 2b, 2c, and 2d are disposed, for example, in a matrix of two rows and two columns. Among the memory units 2a, 2b, 2c, and 2d, the two memory units 2a and 2c (2b and 2d) disposed in the row direction serve as one memory block BK0 (BK1). In the non-volatile semiconductor memory device 1a, a memory well is provided for each of the memory blocks BK0 and BK1, that is, for each pair of the memory units 2a and 2c (2b and 2d) disposed side by side in the row direction.

In the non-volatile semiconductor memory device 1a thus configured, the first control line DL0 (DL1) is shared by the memory units 2a and 2b (2c and 2d), which are disposed side by side in the column direction and provided in the different memory blocks BK0 and BK1, whereas the second control line HS0 (HS1) is shared by the memory units 2a and 2c (2b and 2d), which are provided in the same memory block BK0 (BK1). A first control unit 4a is provided to apply voltage to each of the first control lines DL0 and DL1. A second control unit 4b is provided to apply voltage to each of the second control lines HS0 and HS1.

The memory units 2a, 2b, 2c, and 2d provided to the non-volatile semiconductor memory device 1a have identical configurations, and thus the following describes mainly the configuration of the memory unit 2a on the first row and the first column. In the present embodiment, the memory unit 2a includes two memory cells M11 and M12 connected with the switching mechanism 6a through a sub control line W11.

The switching mechanisms 6a, 6b, 6c, and 6d have identical configurations. For example, the switching mechanism 6a is turned on and off based on a switching gate voltage applied from the second control line HS0. When turned on, the switching mechanism 6a applies a memory gate voltage applied to the first control line DL0 to the corresponding sub control line W11. When turned off, the switching mechanism 6a blocks the voltage application from the first control line DL0 to the sub control line W11.

In the memory unit 2a, the switching mechanism 6a is turned on based on the memory gate voltage applied to the first control line DL0 and the switching gate voltage applied to the second control line HS0 so as to apply the memory gate voltage applied to the first control line DL0 to the memory cells M11 and M12 through the sub control line W11.

The memory cells M11 and M12 have identical configurations. For example, the memory cell M11 includes a switch circuit S11 connected with the drain of a memory transistor F11. The switch circuit S11 is, for example, a bipolar transistor connected with a bit line CL0 as well as the memory transistor F11 so as to receive voltage application from the bit line CL0.

The memory transistor F11 thus configured includes a charge storage layer made of, for example, a nitride film or polysilicon on a memory well through an insulating layer, and includes a gate on the charge storage layer through an insulating layer. With this configuration, the tunneling effect caused by a voltage difference between the memory well and the gate and a voltage difference between the source and gate allows the memory transistor F11 to inject charge into the charge storage layer or remove charge stored in the charge storage layer. In the following description of embodiments, the memory transistor F11 is a depleted N-type MOS transistor. Thus, current flows through the memory transistor F11 when the gate is at 0 V and the source and drain have a potential difference therebetween while no charge is stored in the charge storage layer.

In the present embodiment, for example, at data programming operation in the memory transistor F11, a channel is formed at the surface of the memory well due to the voltage difference between the memory well and the gate and the voltage difference between the source and gate, and is supplied with a source voltage. Accordingly, charge is injected into the charge storage layer through the channel due to the tunneling effect caused by the potential difference between the gate and source, so that the memory transistor F11 becomes a state in which data is programmed therein. At data erasing operation, charge stored in the charge storage layer is removed due to the tunneling effect caused by the voltage difference between the memory well and the gate and the voltage difference between the memory well and the source, so that the memory transistor F11 becomes a state in which data is erased therefrom.

The sub control lines W11, W12, W21, and W22 are also provided as wires for applying memory gate voltages applied to the first control lines DL0 and DL1 to the corresponding memory cells M11, M12, M21, M22, M31, M32, M41, and M42. In addition, the sub control lines W11, W12, W21, and W22 are directly disposed facing to the charge storage layers of the respective memory transistors F11, F12, F21, F22, F31, F32, F41, and F42 and provided as gates of the memory transistors F11, F12, F21, F22, F31, F32, F41, and F42. In other words, when the sub control lines W11, W12, W21, and W22 are made of, for example, polysilicon instead of metal, the memory transistors F11, F12, F21, F22, F31, F32, F41, and F42 are each a polysilicon transistor with a gate made of polysilicon.

In this case, for example, the bit line CL0 on the first column extending in the column direction is connected with the switch circuits S11 and S12 of the memory cells M11 and M12 of the memory unit 2a and also with the switch circuits S21 and S22 of the memory cells M21 and M22 of the memory unit 2b on a column same as that of the memory unit 2a. Similarly, a bit line CL1 on the second column extending in the column direction is connected with the switch circuits S31 and S32 of the memory cells M31 and M32 of the memory unit 2c and also with the switch circuits S41 and S42 of the memory cells M41 and M42 of the memory unit 2d on a column same as that of the memory unit 2c.

As described above, the single bit line CL0 (CL1) of the non-volatile semiconductor memory device 1a is shared by the memory cells M11, M12, M21, and M22 (M31, M32, M41, and M42) arranged in one direction (the column direction). This configuration allows voltage application through the bit line CL0 (CL1) to the switch circuits S11, S12, S21, and S22 (S31, S32, S41, and S42) of the respective memory cells M11, M12, M21, and M22 (M31, M32, M41, and M42) in each column.

In addition, for example, a word line ROW00 on the first row extending in the row direction is shared by the memory cell M11 in the memory unit 2a and the memory cell M31 in the memory unit 2c disposed on a row same as that of the memory unit 2a but on a column different from that of the memory unit 2a. The word line ROW00 is connected with the sources of the memory transistors F11 and F31 provided to the memory cells M11 and M31.

In addition, a word line ROW01 on the second row extending in the row direction on a row different from that of the word line ROW00 is shared by the memory cell M12 in the memory unit 2a and the memory cell M32 in the memory unit 2c disposed on a row same as that of the memory unit 2a but on a column different from that of the memory unit 2a. The word line ROW01 is connected with the sources of the memory transistors F12 and F32 provided to the memory cells M12 and M32.

As described above, the single word line ROW00 (ROW01) of the non-volatile semiconductor memory device 1a is shared by the memory cells M11 and M31 (M12 and M32) arranged in the other direction (row direction) different from the one direction. This configuration allows voltage application through the word line ROW00 (ROW01) to the sources of the memory transistors F11 and F31 (F12 and F32) in each row.

The memory unit 2b on the second row and the first column and the memory unit 2d on the second row and the second column have configurations same as the above-described configurations of the memory units 2a and 2c. A single word line ROW10 (ROW11) extending in the other direction (row direction) is shared by the memory cell M21 (M22) of the memory unit 2b and the memory cell M41 (M42) of the memory unit 2d.

Specifically, the word line ROW10 (ROW11) provided across the memory units 2b and 2d arranged in the row direction is connected with the sources of the memory transistors F21 and F41 (F22 and F42) to allow uniform voltage application to the sources of the memory transistors F21 and F41 (F22 and F42) from the word line ROW10 (ROW11).

The following simply describes, for example, an operation to program data only to the memory cell M11 disposed in the memory unit 2a on the first row and the first column but not to program data to the memory cell M12 in the memory unit 2a nor the memory cells M21, M22, M31, M32, M41, and M42 disposed in the other memory units 2b, 2c, and 2d.

In this case, for example, a positive charge storage memory gate voltage is applied, as a memory gate voltage, to a first control line (hereinafter also referred to as a select first control line) DL0 provided for the memory unit 2a including the memory cell (hereinafter also referred to as a programming memory cell) M11 into which data is programmed. In addition, a charge storage prevention memory gate voltage of 0 V is applied, as a memory gate voltage, to another first control line (hereinafter also referred to as a non-select first control line) DL1 provided only for the memory cells (hereinafter also referred to as non-programming memory cells) M31, M32, M41, and M42 into which data is not programmed.

Simultaneously, an on voltage is applied, as a switching gate voltage, from the second control line HS0 to the switching mechanism (hereinafter also referred to as a select switching mechanism) 6a connected with the programming memory cell M11. Accordingly, among the switching mechanisms 6a and 6b disposed on the select first control line DL0, only the select switching mechanism 6a, to which the on voltage is applied from the second control line HS0, is turned on. The select switching mechanism 6a applies the charge storage memory gate voltage applied to the select first control line DL0 to the sub control line (hereinafter also referred to as a select sub control line) W11 connected with the programming memory cell M11. Accordingly, the charge storage memory gate voltage applied to the select first control line DL0 is applied to the gate of the memory transistor F11 of the programming memory cell M11 through the select sub control line W11.

In addition, simultaneously, for example, a negative voltage is applied to the source of the memory transistor F11 of the programming memory cell M11 through the word line ROW00, and also to the memory well of the memory transistor F11. Accordingly, in the memory transistor F11 of the programming memory cell M11, charge is injected into the charge storage layer through the source due to the tunneling effect caused by a voltage difference (for example, a voltage difference of 7 V) between the gate and the memory well or the gate and source, thereby achieving a data programmed state.

Simultaneously, for example, a voltage of 0 V is applied, through the word line ROW01, to the source of the memory transistor F12 of the memory cell M12, which shares the select sub control line W11 with the programming memory cell M11 and into which data is not programmed. Accordingly, when a charge storage memory gate voltage is applied to the gate of the memory transistor F12 of the non-programming memory cell M12 through the select sub control line W11 similarly to the programming memory cell M11, the voltage of 0 V is applied from the word line ROW01 to the source of the memory transistor F12, thereby reducing the voltage difference between the gate and source of the memory transistor F12.

As a result, when the charge storage memory gate voltage is applied to the non-programming memory cell M12, which shares the select sub control line W11 with the programming memory cell M11, through the select sub control line W11, the voltage difference between the gate and source of the memory transistor F12 is reduced such that charge is unlikely to be injected into the non-programming memory cell M12, thereby maintaining a no-data programmed state.

Simultaneously, an off voltage is applied, as a switching gate voltage, from the second control line HS1 to the switching mechanism (hereinafter also referred to as a non-select switching mechanism) 6b connected with the select first control line DL0 to which a charge storage memory gate voltage is applied, and provided only for the non-programming memory cells M21 and M22. Accordingly, the non-select switching mechanism 6b is turned off to block electrical connection between the select first control line DL0 and the non-select sub control line W12, thereby preventing application of the charge storage memory gate voltage applied to the select first control line DL0 to the memory cells M21 and M22.

As a result, in the memory unit 2b sharing the select first control line DL0 and only including the non-programming memory cells M21 and M22, no charge storage memory gate voltage is applied from the select first control line DL0 to the non-select sub control line W12. Thus, voltage adjustment on, for example, the word lines ROW10 and ROW11 can prevent charge injection into the memory transistors F21 and F22 of the non-programming memory cells M21 and M22, thereby maintaining no-data programmed states.

As described above, the select sub control line W11 is shared by the non-programming memory cell M12 and the programming memory cell M11 in the memory unit 2a including the programming memory cell M11. This configuration allows application of a high charge storage memory gate voltage from the select sub control line W11 to the memory transistor F12 of the non-programming memory cell M12. Thus, when the data programming operation is repeated on the memory cell M11, unwanted charge is stored in the charge storage layer of the memory cell M12, into which data is not to be programmed, due to a voltage difference repeatedly caused at the memory transistor F12 like conventional cases, which is likely to eventually cause disturbance.

However, when the data programming operation is repeated on the memory unit 2a, the switching mechanism 6b blocks the charge storage memory gate voltage applied to the select first control line DL0 in the memory unit 2b, which shares the select first control line DL0 with the memory unit 2a including the programming memory cell M11, thereby preventing disturbance at all non-programming memory cells M21 and M22.

Thus, in the non-volatile semiconductor memory device 1a according to the present invention, which includes the memory cells M11, M12, M21, and M22 arranged in one direction along the select first control line DL0, the occurrence of disturbance can be restricted only to the memory unit 2a and prevented in the memory cells M21 and M22 of the memory unit 2b. Accordingly, the occurrence rate of disturbance can be reduced as compared to conventional cases.

In the non-volatile semiconductor memory device 1a, the sub control lines W11, W12, W21, and W22 are provided as connection wires for applying the memory gate voltages applied to the first control lines DL0 and DL1, from the switching mechanisms 6a, 6b, 6c, and 6d to the memory cells M11, M12, M21, and M22, M31, M32, M41, and M42. The sub control lines W11, W12, W21, and W22 also function as the gates of the corresponding memory transistors F11, F12, F21, F22, F31, F32, F41, and F42. This configuration allows a simplified circuit configuration as compared to a case in which the gates of the memory transistors F11, F12, F21, F22, F31, F32, F41, and F42 are separately provided in, for example, a wiring layer in a region different from that of a wiring layer in which the sub control lines W11, W12, W21, and W22 are formed, thereby achieving downsizing accordingly.

Figure 2:
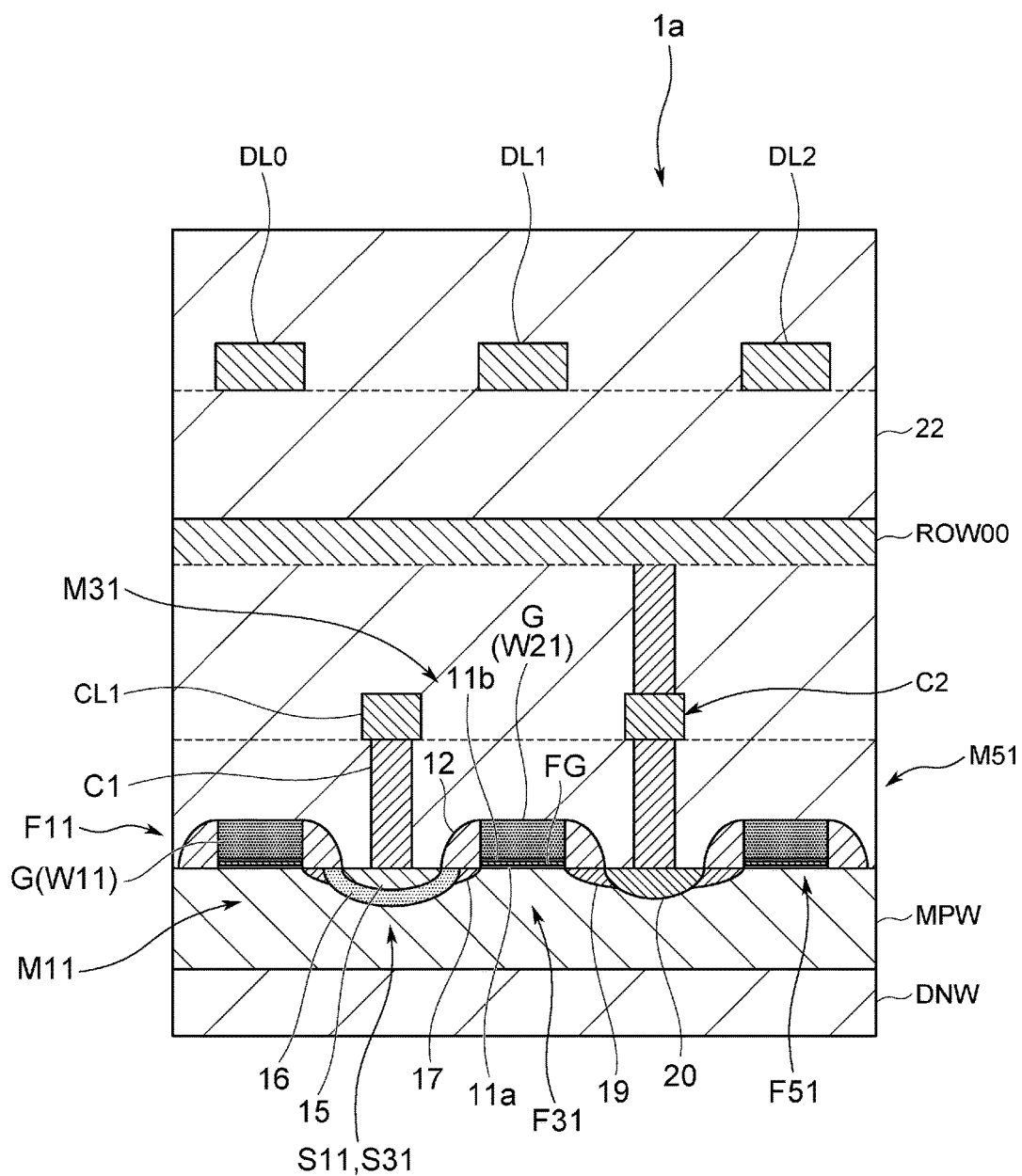
FIG. 2 is a schematic view illustrating a sectional configuration of a region in which a plurality of memory cells are arranged in a row direction.

The following describes a sectional configuration of a region including the memory cell M11 on the first row and the first column, the memory cell M31 on the first row and the second column, and a memory cell M51 on the first row and the third column, which is not illustrated in FIG. 1, as illustrated in FIG. 2. In the region including the memory cells M11, M31, and M51 in the non-volatile semiconductor memory device 1a, for example, a P-type memory well MPW is formed on an N-type deep well DNW as illustrated in FIG. 2. The memory transistors F11, F31, and F51 are formed on the surface of the memory well MPW.

For example, the memory transistor F31 of the memory cell M31 includes an insulating layer 11a, a charge storage layer FG, an insulating layer 11b, and a gate G stacked in this order on the surface of the memory well MPW. Sidewalls 12 are disposed to cover side surfaces of the insulating layer 11a, the charge storage layer FG, the insulating layer 11b, and the gate G. In this case, an N-type diffusion layer 19 serving as the source of the memory transistor F31 is disposed on the surface of the memory well MPW below one of the sidewalls 12, and an N-type diffusion layer 17 serving as the drain of the memory transistor F31 is disposed on the surface of the memory well MPW below the other sidewall 12. The channel of the memory transistor F31 is formed in the memory well MPW between the diffusion layers 17 and 19.

The sub control line W21 serves as the gate G of the memory transistor F31. Specifically, a region of the sub control line W21, which faces to the charge storage layer FG, serves as the gate G. In the non-volatile semiconductor memory device 1a thus configured, a sub control line W31, which serves as a connection wire connecting the memory transistor F31 and the switching mechanism 6c (FIG. 1), and the gate G of the memory transistor F31 are disposed in one wiring layer. This configuration allows a simplified circuit configuration as compared to a case in which the gate G of the memory transistor F31 and the sub control line W31 are disposed in separate wiring layers, thereby achieving downsizing.

An N-type diffusion layer 16 having an impurity concentration different from that of the diffusion layer 17 is disposed below the other sidewall 12 where the diffusion layer 17 serving as a drain is provided. The diffusion layer 16 is provided across a region extending from below the other sidewall 12 of the memory transistor F31 to below one of the sidewalls 12 of the memory transistor F11 disposed next to the memory transistor F31. In addition, a P-type diffusion layer 15 is disposed above the diffusion layer 16 while being enclosed by the diffusion layer 16. The diffusion layer 15 is provided across a region extending from an end of the other sidewall 12 of the memory transistor F31 to an end of the one sidewall 12 of the memory transistor F11 disposed next to the memory transistor F31. Accordingly, the P-type memory well MPW, the N-type diffusion layer 16, and the P-type diffusion layer 15 are disposed in this order from the deep well DNW between the sidewalls 12 of the adjacent memory transistors F11 and F31 to form the switch circuits S11 and S31 each having a bipolar MOS transistor configuration.

A column-shaped contact C1 is vertically provided on the surface of the diffusion layer 15 in the switch circuits S11 and S31, and has a leading end connected with the bit line CL1. The bit line CL1 is, for example, a metal wire, and disposed in a first metallic layer above the wiring layer in which the gates G of the memory transistors F11, F31, and F51 are disposed on the surface of the memory well MPW.

An N-type diffusion layer 20 having an impurity concentration different from that of the diffusion layer 19 is disposed on the surface of the memory well MPW between the memory transistor F31 and the adjacent memory transistor F51 on the other side of the memory transistor F31. A column-shaped contact C2 is vertically provided on the surface of the diffusion layer 20. The contact C2 is connected with the word line ROW00 disposed in a second metallic layer above the first metallic layer in which the bit line CL1 is disposed, and allows voltage application from the word line ROW00 to the diffusion layer 20.

The word line ROW00 extends in the row direction along the memory cells M11, M31, and M51 arranged in the row direction and applies voltage to the memory cells M11, M31, and M51. A third metallic layer is disposed above the second metallic layer in which the word line ROW00 is disposed. The first control lines DL0, DL1, and DL3 as metal wires are disposed in the third metallic layer. The memory transistors F11, F31, and F51, the contacts C1 and C2, the bit line CL1, the word line ROW00, and the first control lines DL0, DL1, and DL2, which are disposed on the surface of the memory well MPW, are covered by an insulating layer 22.

(1-2) Non-Volatile Semiconductor Memory Device in which Switching Gate Voltage is Applied to First Control Line and Memory Gate Voltage is Applied to Second Control Line The above-described embodiment describes the non-volatile semiconductor storage memory 1a in which a memory gate voltage is applied to the first control lines DL0 and DL1 and a switching gate voltage is applied to the second control lines HS0 and HS1. However, the present invention is not limited thereto but is applicable to a non-volatile semiconductor memory device 1b in which a switching gate voltage is applied to the first control lines DL0 and DL1 and a memory gate voltage is applied to the second control lines HS0 and HS1. In this case, in the non-volatile semiconductor memory device 1b illustrated in FIG. 1, the switching mechanisms 6a, 6b, 6c, and 6d are turned on and off based on a voltage difference between the switching gate voltage applied to the first control lines DL0 and DL1 and the memory gate voltage applied to the second control lines HS0 and HS1.

In the non-volatile semiconductor memory device 1b, the sub control lines W11, W12, W21, and W22 are provided as connection wires for applying the memory gate voltage applied to the second control lines HS0 and HS1, from the switching mechanisms 6a, 6b, 6c, and 6d to the memory cells M11, M12, M21, and M22, M31, M32, M41, and M42. The sub control lines W11, W12, W21, and W22 function as the gates of the corresponding memory transistors F11, F12, F21, F22, F31, F32, F41, and F42. This configuration allows a simplified circuit configuration as compared to a case in which the gates of the memory transistors F11, F12, F21, F22, F31, F32, F41, and F42 are separately provided in, for example, a wiring layer in a region different from that of the wiring layer in which the sub control lines W11, W12, W21, and W22 are disposed, thereby achieving downsizing accordingly.

The following simply describes, for example, an operation to program data only to the memory cell M11 disposed in the memory unit 2a on the first row and the first column but not to program data to the memory cell M12 in the memory unit 2a nor the memory cells M21, M22, M31, and M32, M41, and M42 disposed in the other memory units 2b, 2c, and 2d. In this case, for example, an on voltage is applied, as a switching gate voltage, to the select first control line DL0 provided for the memory unit 2a including the programming memory cell M11, whereas an off voltage is applied, as a switching gate voltage, to the non-select first control line DL1 provided only for the non-programming memory cells M31, M32, M41, and M42 into which data is not programmed.

A charge storage memory gate voltage is applied, as a memory gate voltage, to the select second control line HS0 connected with the select switching mechanism 6a. Accordingly, the select switching mechanism 6a disposed on the select second control line HS0 is turned on based on the on voltage applied to the select first control line DL0 and the charge storage memory gate voltage applied to the select second control line HS0, and applies the charge storage memory gate voltage applied to the select second control line HS0, to the select sub control line W11 connected with the programming memory cell M11. Accordingly, the charge storage memory gate voltage applied to the select second control line HS0 is applied to the gate of the memory transistor F11 of the programming memory cell M11 through the select sub control line W11.

In addition, for example, a negative voltage is applied to the source of the memory transistor F11 of the programming memory cell M11 through the word line ROW00, and applied also to the memory well of the memory transistor F11. Accordingly, the memory transistor F11 of the programming memory cell M11, charge is injected into the charge storage layer through the source due to the tunneling effect caused by a voltage difference (for example, a voltage difference of 7 V) between the gate and the memory well or between the gate and source, thereby achieving a data programmed state.

The voltage of 0 V, for example, is applied through the word line ROW01 to the source of the memory transistor F12 of the memory cell M12, which shares the select sub control line W11 with the programming memory cell M11 and into which data is not programmed. Accordingly, when the charge storage memory gate voltage is applied through the select sub control line W11, the voltage difference between the gate and source of the memory transistor F12 is reduced such that charge is unlikely to be injected, thereby maintaining a no-data programmed state.

Simultaneously, in the non-select switching mechanism 6b sharing the select first control line DL0 to which the on voltage is applied, and provided only for the non-programming memory cells M21 and M22, the voltage applied from the second control line HS1 blocks electrical connection between the second control line HS1 and the sub control line W12, thereby preventing application of the memory gate voltage from the second control line HS1 to the memory cells M21 and M22 through the sub control line W12.

As a result, in the memory unit 2b sharing the select first control line DL0 and only including the non-programming memory cells M21 and M22, no charge storage memory gate voltage is applied from the second control line HS1 to the non-select the sub control line W12. Thus, voltage adjustment on, for example, the word lines ROW10 and ROW11 can prevent charge injection into the memory transistors F21 and F22 of the non-programming memory cells M21 and M22, thereby maintaining no-data programmed states.

In the present embodiment, too, as described above, the select sub control line W11 is shared by the non-programming memory cell M12 and the programming memory cell M11 in the memory unit 2a including the programming memory cell M11. This configuration allows application of a high charge storage memory gate voltage from the select sub control line W11 to the memory transistor F12 of the non-programming memory cell M12. Thus, in the memory unit 2a, when the data programming operation is repeated on the memory cell M11, unwanted charge is stored in the charge storage layer of the memory cell M12, into which data is not to be programmed, due to a voltage difference repeatedly caused at the memory transistor F12 like conventional cases, which is likely to eventually cause disturbance.

However, when the data programming operation is repeated on the memory unit 2a, the switching mechanism 6b blocks voltage application from the non-select second control line HS1 to the non-select sub control line W12 in the memory unit 2b, which shares the select first control line DL0 with the memory unit 2a including the programming memory cell M11. Thus, only voltage adjustment on, for example, the word lines ROW10 and ROW11 can prevent disturbance at all non-programming memory cells M21 and M22.

Thus, in the non-volatile semiconductor memory device 1b according to the present invention, which includes the memory cells M11, M12, M21, and M22 arranged in one direction along the select first control line DL0, the occurrence of disturbance can be restricted only to the memory unit 2a and prevented in the memory cells M21 and M22 of the memory unit 2b. Accordingly, the occurrence rate of disturbance can be reduced as compared to conventional cases.

Since an off voltage is applied, as a switching gate voltage, from the first control line DL1 to the non-select switching mechanism 6c sharing the select second control line HS0, to which the charge storage memory gate voltage is applied, and provided only for the non-programming memory cells M31 and M32, this configuration blocks application of the charge storage memory gate voltage from the select second control line HS0 to the sub control line W21. As a result, no charge storage memory gate voltage is applied from the select second control line HS0 to the non-select sub control line W21 in the memory unit 2c sharing the select second control line HS0 and only including the non-programming memory cells M31 and M32. Accordingly, no charge is injected into the memory transistors F31 and F32 of the non-programming memory cells M31 and M32, thereby maintaining no-data programmed states.

Since the memory unit 2d on the second row and the second column is connected with the non-select second control line HS1, no charge storage memory gate voltage is applied to the sub control line W22, and thus no data is programmed into the non-programming memory cells M41 and M42.

The following sequentially describes a non-volatile semiconductor memory device according to a first embodiment as the non-volatile semiconductor memory device 1a illustrated in FIG. 1 having a more specific circuit configuration, and non-volatile semiconductor memory devices according to second and third embodiments each as the non-volatile semiconductor memory device 1b illustrated in FIG. 1 having a more specific circuit configuration. The description will be made on data programming operation, data reading operation, and data erasing operation at each non-volatile semiconductor memory device.

(2) Non-Volatile Semiconductor Memory Device According to First Embodiment

Figure 3:
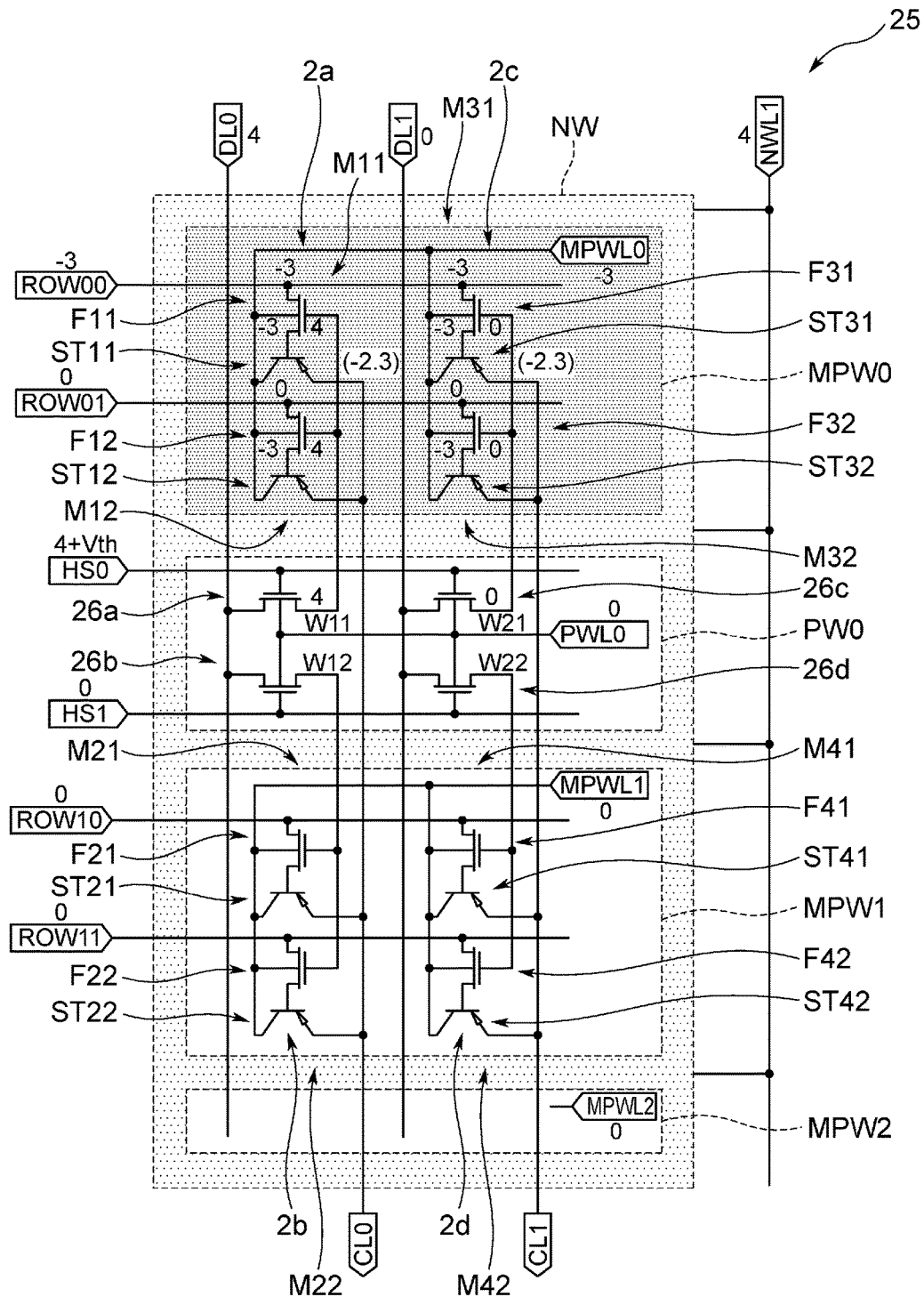
FIG. 3 is a schematic view illustrating voltage at each site in a circuit configuration of a non-volatile semiconductor memory device according to a first embodiment at data programming operation.

FIG. 3 illustrates a circuit configuration of a non-volatile semiconductor memory device 25 according to the first embodiment. A memory gate voltage is applied to the first control lines DL0 and DL1, and a switching gate voltage is applied to the second control lines HS0 and HS1. In this case, PNP bipolar switch transistors ST11, ST12, ST21, ST22, ST31, ST32, ST41, and ST42 are provided as the switch circuits S11, S12, S21, S22, S31, S32, S41, and S42 illustrated in FIG. 1, and N-type MOS switching transistors 26a, 26b, 26c, and 26d are provided as the switching mechanisms 6a, 6b, 6c, and 6d illustrated in FIG. 1.

Similarly to the non-volatile semiconductor memory device illustrated in FIG. 1, the non-volatile semiconductor memory device 25 illustrated in FIG. 3 includes the four memory units 2a, 2b, 2c, and 2d disposed in a matrix of two rows and two columns. The memory units 2a and 2b on the first column share the first control line DL0, and the memory units 2c and 2d on the second column share the first control line DL1.

The non-volatile semiconductor memory device 25 includes a P-type memory well MPW0 enclosed by an N-type well NW and another P-type memory well MPW1 enclosed by the N-type well NW. A P-type switching mechanism formation well PW0 enclosed by the N-type well NW is disposed between the memory wells MPW0 and MPW1. In this case, the memory well MPW0 includes the memory units 2a and 2c disposed on the first row, and the memory well MPW1 includes the memory units 2b and 2d disposed on the second row.

The switching mechanism formation well PW0 disposed between the memory wells MPW0 and MPW1 includes the switching transistors 26a and 26b of the memory units 2a and 2b disposed in a region between the memory units 2a and 2b adjacent to each other in the column direction. In addition, the switching mechanism formation well PW0 includes the switching transistors 26c and 26d of the memory units 2c and 2d disposed in a region between the memory units 2c and 2d adjacent to each other in the column direction. The switching mechanism formation well PW0 including the switching transistors 26a, 26b, 26c, and 26d is connected with a switching mechanism formation well wire PWL0 to receive voltage application through the switching mechanism formation well wire PWL0.

In the non-volatile semiconductor memory device 25, the switching transistors 26a, 26b, 26c, and 26d of the four memory units 2a, 2b, 2c, and 2d adjacent to each other in the matrix are provided for the single switching mechanism formation well PW0. This configuration avoids unnecessary separate formation of the switching mechanism formation well PW0, thereby achieving minimization of the formation area of the switching transistors 26a, 26b, 26c, and 26d. In FIG. 3, MPW2 denotes a memory well including a memory unit (not illustrated) on the third row. Description of the memory well MPW2 would duplicate the above description of the memory well MPW0, and thus description and illustration thereof will be omitted.

The memory cells M11, M12, M21, M22, M31, M32, M41, and M42 disposed in the memory wells MPW0 and MPW1 have identical configurations. For example, the memory unit 2a on the first row and the first column includes the memory cells M11 and M12 each selectively connected with the first control line DL0 through the switching transistor 26a.

Since the memory cells M11, M12, M21, M22, and M31, M32, M41, and M42 have identical configurations, the following mainly describes the memory cell M11 among them. In the memory cell M11, the drain of the memory transistor F11 including the charge storage layer is connected with the base of the switch transistor ST11. The switch transistor ST11 has a collector connected with a memory well wire MPWL0 and an emitter connected with the bit line CL0.

The memory well wire MPWL0 is connected with the memory well MPW0 in which the memory units 2a and 2c arranged in the row direction are disposed, and the collectors of the switch transistors ST11, ST12, ST31, and ST32 disposed in the memory units 2a and 2c arranged in the row direction. This configuration allows uniform voltage application to the memory well MPW0 and the collectors of the switch transistors ST11, ST12, ST31, and ST32.

Another memory well wire MPWL1 is connected with the memory well MPW1 different from the memory well MPW0 connected with the memory well wire MPWL0, and the collectors of the switch transistors ST21, ST22, ST41, and ST42 of the memory units 2b and 2d arranged in the row direction in the memory well MPW1. This configuration allows uniform voltage application to the memory well MPW1 and the collectors of the switch transistors ST21, ST22, ST41, and ST42.

The bit line CL0 connected with the emitter of the switch transistor ST11 is also connected with the emitters of the switch transistors ST12, ST21, and ST22 in the other memory cells M12, M21, and M22 arranged in the column direction. This configuration allows uniform voltage application to the emitters of the switch transistors ST11, ST12, ST21, and ST22 arranged in the column direction. Similarly, in the other memory cells M31, M32, M41, and M42 arranged in the column direction, the bit line CL1 is shared by the switch transistors ST31, ST32, ST41, and ST42. This configuration allows uniform voltage application from the bit line CL1 to the emitters of the switch transistors ST31, ST32, ST41, and ST42.

The word line ROW00 connected with the source of the memory transistor F11 is also connected with the source of the memory transistor F31 disposed on a row same as that of the memory transistor F11. This configuration allows uniform voltage application to the memory transistors F11 and F31 arranged in the row direction. Similarly, in the memory transistors F12 and F32 (F21 and F41, or F22 and F42), the word line ROW01 (ROW10 or ROW11) is provided for each row on which the memory transistors F12 and F32 (F21 and F41, or F22 and F42) are disposed. This configuration allows uniform voltage application from the word line ROW01 (ROW10 or ROW11) to the memory transistors F12 and F32 (F21 and F41, F22 and F42) arranged in the row direction.

Additionally, the memory unit 2a is provided with the single sub control line W11 as a connection wire for applying a memory gate voltage applied to the first control line DL0 to the memory transistors F11 and F12. The sub control line W11 is disposed facing to the charge storage layers of the memory transistors F11 and F12 to serve as the gates of the memory transistors F11 and F12.

As described above, in the non-volatile semiconductor memory device 25, the sub control lines W11, W12, W21, and W22 are provided as connection wires for applying, from the switching transistors 26a, 26b, 26c, and 26d to the memory cells M11, M12, M21, M22, and M31, M32, M41, and M42, the memory gate voltages applied to the first control lines DL0 and DL1, and are also provided as the gates of the corresponding memory transistors F11, F12, F21, F22, F31, F32, F41, and F42. This configuration allows a simplified circuit configuration as compared to a case in which, for example, the gate of each memory transistor is separately provided in a wiring layer in the region different from that of the wiring layer in which the sub control lines W11, W12, W21, and W22 are disposed, thereby achieving downsizing accordingly.

The switching transistor 26a provided to the memory unit 2a thus configured has a gate connected with the second control line HS0, a drain connected with the first control line DL0, and a source connected with the sub control line W11. The second control line HS0 is also connected with the gate of the switching transistor 26c on a row same as that of the switching transistor 26a. This configuration allows uniform voltage application to the gates of the switching transistors 26a and 26c. Similarly, the second control line HS1 on another row is connected with the gates of the switching transistors 26b and 26d on the same row. This configuration allows uniform voltage application to the gates of the switching transistors 26b and 26d.

The first control line DL0 connected with the drain of the switching transistor 26a is also connected with the drain of the switching transistor 26b on a column same as that of the switching transistor 26a. This configuration allows uniform voltage application to the drains of the switching transistors 26a and 26b. Similarly, the first control line DL1 on another column is connected with the drains of the switching transistors 26c and 26d on the same column. This configuration allows uniform voltage application to the drains of the switching transistors 26c and 26d.

Figure 4:
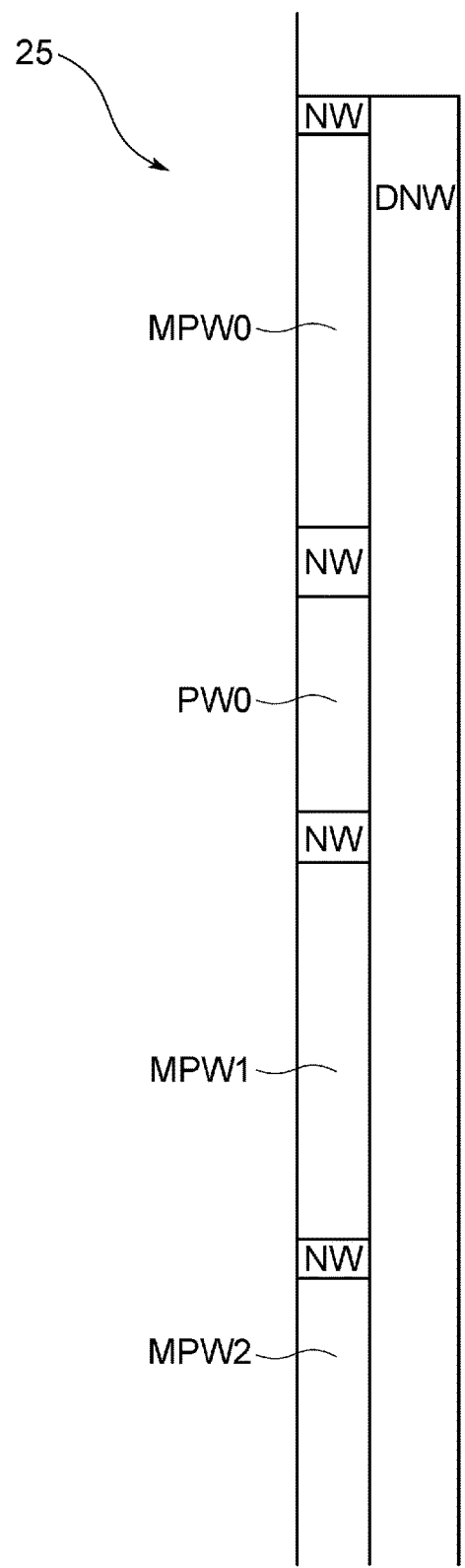
FIG. 4 is a schematic view illustrating the configurations of a memory well, a switching mechanism formation well, and a well disposed on a deep well in the non-volatile semiconductor memory device according to the first embodiment.

The non-volatile semiconductor memory device 25 includes a well wire NWL1 connected with the well NW surrounding the memory wells MPW0, MPW1, and MPW2 and the switching mechanism formation well PW0. This configuration allows uniform voltage application from the well wire NWL1 to the well NW. As illustrated in FIG. 4, the memory wells MPW0, MPW1, and MPW2 and the switching mechanism formation well PW0 of the non-volatile semiconductor memory device 25 are disposed on the N-type deep well DNW. The deep well DNW and the well NW electrically insulate the memory wells MPW0, MPW1, and MPW2 and the switching mechanism formation well PW0. The following sequentially describes data programming operation, data reading operation, and data erasing operation of the non-volatile semiconductor memory device 25 having the above-described configuration.

(2-1) Data Programming Operation

FIG. 3 indicates voltage at each site when data is programmed into the memory cell (programming memory cell) M11 in the memory unit 2a on the first row and the first column, the other memory cell (non-programming memory cell) M12 in the memory unit 2a but no data is programmed into the memory cells (non-programming memory cells) M21, M22, M31, M32, M41, and M42 in the other memory units 2b, 2c, and 2d.

In this case, a charge storage memory gate voltage of 4 V is applied to the first control line DL0 on which the programming memory cell M11 is disposed, and a charge storage prevention memory gate voltage of 0 V is applied to the first control line DL1 on which only the non-programming memory cells M31, M32, M41, and M42 are disposed.

An on voltage of 4+Vth (Vth represents threshold voltages of the switching transistors 26a, 26b, 26c, and 26d) V is applied, as a switching gate voltage, from the second control line HS0 to the gate of the switching transistor 26a connected with the programming memory cell M11 among the switching transistors 26a and 26b connected with the first control line DL0 to which the charge storage memory gate voltage is applied. In addition, a voltage of 0 V is applied from the switching mechanism formation well wire PWL0 to the switching mechanism formation well PW0. Accordingly, the switching transistor 26a is turned on to electrically connect the first control line DL0 and the sub control line W11 and apply the charge storage memory gate voltage applied to the first control line DL0 to the sub control line W11.

As a result, in the programming memory cell M11, the charge storage memory gate voltage applied to the sub control line W11 from the first control line DL0 through the switching transistor 26a is applied to the gate of the memory transistor F11. Simultaneously, a charge storage memory gate voltage of 4 V, which is smaller, by Vth V, than the switching gate voltage applied to the gate of the switching transistor 26a, is applied to the gate of the memory transistor F11 of the programming memory cell M11. The switching gate voltage is set to 4+Vth V because the output of the switching transistor 26a decreases from the switching gate voltage applied to the gate thereof by the threshold voltage Vth of the transistor. Thus, the switching gate voltage needs to be 4+Vth V or larger to have the output of the switching transistor 26a at 4 V. For this reason, in the data programming operation in the present embodiment, the switching gate voltage applied to the gate of the switching transistor 26a is higher than the charge storage memory gate voltage. Methods for solving such a problem will be described later in "(3) Non-volatile semiconductor memory device according to second embodiment" and "(4) Non-volatile semiconductor memory device according to third embodiment".

A voltage of −3 V is applied to the word line (hereinafter also referred to as a select word line) ROW00 connected with the source of the memory transistor F11 of the programming memory cell M11, and a voltage of −3 V is applied, through the memory well wire MPWL0, to the memory well MPW0 in which the programming memory cell M11 is provided. Accordingly, in the memory transistor F11 of the programming memory cell M11, charge is injected into the charge storage layer through the source due to the tunneling effect caused by a voltage difference (7 V) between the voltage (−3 V) applied to the memory well MPW0 and the source and the charge storage memory gate voltage (4 V) applied to the gate, thereby achieving a data programmed state.

A voltage of 4 V, which is equal to that applied to the second control line HS0, is applied to the well NW surrounding the memory wells MPW0 and MPW1 and the switching mechanism formation well PW0. However, any optional voltage may be applied that achieves electrical insulation among the memory wells MPW0 and MPW1 and the switching mechanism formation well PW0 enclosed by the well NW or between a semiconductor substrate (not illustrated) below the deep well DNW and the memory wells MPW0 and MPW1 and the switching mechanism formation well PW0.

Since the memory well wire MPWL0 to which the voltage of −3 V is applied is also connected with the collectors of the switch transistors ST11 and ST12 of the memory unit 2a including the programming memory cell M11, the voltage of −3 V is applied to the collectors of the switch transistors ST11 and ST12. In the memory unit 2a including the programming memory cell M11, the memory transistor F11 is turned on and the voltage of −3 V applied to the select word line ROW00 is applied to the drain of the memory transistor F11. Accordingly, the base of the switch transistor ST11 is at −3 V, and the bit line CL0 is at −2.3 V, which is larger by a built-in voltage.

Simultaneously, a voltage of 0 V is applied from the non-select word line ROW01 to the source of the memory transistor F12 of the non-programming memory cell M12 disposed in the memory unit 2a including the programming memory cell M11. Accordingly, in the non-programming memory cell M12 in the memory unit 2a including the programming memory cell M11, a charge storage memory gate voltage of 4 V is applied to the gate of the memory transistor F12 from the first control line DL0 through the switching transistor 26a and the sub control line W11. However, the source of the memory transistor F12 is at 0 V, and thus the voltage difference between the gate and source is small enough to reduce charge injection into the charge storage layer, thereby maintaining a no-data programmed state. Simultaneously, the base potential of the switch transistor ST12 of the non-programming memory cell M12 is 0 V, which is the same potential as that of the word line ROW01, because the memory transistor F12 is turned on. Accordingly, the switch transistor ST12 is turned off.

Figure 5:
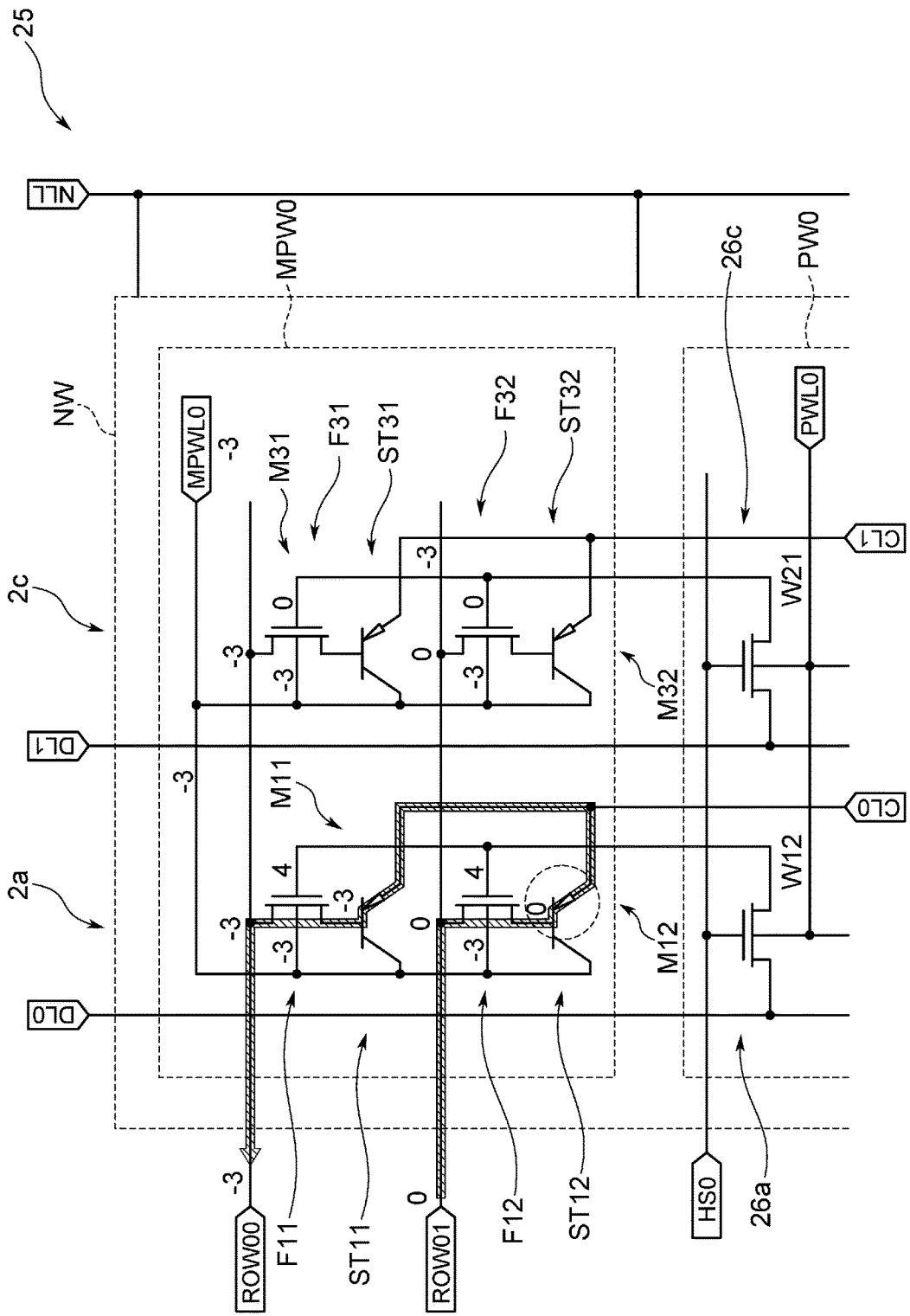

As illustrated in FIG. 5, when all switch transistors ST11 and ST12 are turned on in the memory unit 2a including the programming memory cell M11, the non-select word line ROW01 connected with the non-programming memory cell M12 is electrically connected with the bit line CL0 through the memory transistor F12 of the non-programming memory cell M12 and the switch transistor ST12 being turned on. The bit line CL0 is electrically connected with the select word line ROW00 connected with the programming memory cell M11, through the switch transistor ST11 of the programming memory cell M11, which is turned on, and the memory transistor F11.

As a result, in the programming memory cell M11, the non-select word line ROW01 to which the voltage of 0 V is applied is electrically connected with the drain of the memory transistor F11. Accordingly, the memory transistor F11 cannot have a voltage difference sufficient to cause the tunneling effect, and cannot achieve charge injection into the charge storage layer. For this reason, in the memory unit 2a including the programming memory cell M11, at least the switch transistor ST12 of the non-programming memory cell M12 needs to be turned off.

The following describes the memory unit 2b provided on the first control line DL0 to which the charge storage memory gate voltage is applied as illustrated in FIG. 3. The memory unit 2b only includes the memory cells (non-programming memory cells) M21 and M22 into which no data is programmed. In this case, in the memory unit 2b, an off voltage of 0 V is applied to the second control line HS1 connected with the gate of the switching transistor 26b. Accordingly, in the memory unit 2b, the switching transistor 26b is turned off to block the charge storage memory gate voltage applied to the first control line DL0, so that the charge storage memory gate voltage is not applied to the sub control line W12. This operation leaves the voltage of the sub control line W12 unset. Thus, the potentials of the sub control lines W11, W12, W21, and W22 are set to a charge storage prevention memory gate voltage of 0 V in advance before the data programming operation is started.

Simultaneously, a voltage of 0 V is applied to the sources of the memory transistors F21 and F22 of the non-programming memory cells M21 and M22 through the word lines ROW10 and ROW11. Simultaneously, a voltage of 0 V is applied, through the memory well wire MPWL1, to the memory well MPW1 in which only the non-programming memory cells M21, M22, M41, and M42 are disposed. Accordingly, in each of the memory transistors F21 and F22 of the non-programming memory cells M21 and M22, the voltage difference between the gate and the memory well MPW1 and the voltage difference between the gate and source are 0 V, so that no charge is injected into the charge storage layers of the memory transistors F21 and F22, and thus a no-data programmed state is maintained. In this case, too, in each of the switch transistors ST21 and ST22, the bit line CL0 connected with the emitter is at −2.3 V through the above-described operation, whereas the base voltage only takes a negative value obtained by subtracting the threshold voltages of the memory transistors F21 and F22 from the voltage of 0 V applied to the word lines ROW10 and ROW11. Accordingly, the switch transistors ST21 and ST22 are each turned off with no current flowing between the emitter and base.

As described above, in the memory unit 2a including the programming memory cell M11, the charge storage memory gate voltage applied to the first control line DL0 is also applied to the memory transistor F12 of the non-programming memory cell M12 through the select sub control line W11, which causes a slight voltage difference in the memory transistor F12 of the non-programming memory cell M12. Thus, in the non-programming memory cell M12 in the memory unit 2a including the programming memory cell M11, when the charge storage memory gate voltage is repeatedly applied due to repetition of the data programming operation on the programming memory cell M11 sharing the select sub control line W11, disturbance is likely to occur.

However, in the memory unit 2b only including the non-programming memory cells M21 and M22 and provided on the first control line DL0 to which the charge storage memory gate voltage is applied, the charge storage memory gate voltage applied to the first control line DL0 is blocked by the switching transistor 26b and not applied to the sub control line W12, which significantly reduces voltage differences at the memory transistors F21 and F22 and thus prevents disturbance.

As described above, in the non-volatile semiconductor memory device 25 according to the present invention including the memory cells M11, M12, M21, and M22 arranged in one direction like conventional cases, disturbance is prevented in the memory cells M21 and M22 of the memory unit 2b sharing the first control line DL0 with the memory unit 2a including the programming memory cell M11, and accordingly, overall generation of disturbance is reduced as compared to conventional cases.

The following describes the memory unit 2c on the first row and the second column, which includes the non-programming memory cell M31 sharing the word line ROW00 with the programming memory cell M11. An on voltage of 4+Vth V is applied to the gate of the switching transistor 26c provided to the memory unit 2c on the first row and the second column from the second control line HS0 shared by the switching transistor 26a connected with the programming memory cell M11.

Simultaneously, a charge storage prevention memory gate voltage of 0 V is applied from the first control line DL1 to the drain of the switching transistor 26c provided to the memory unit 2c only including the non-programming memory cells M31 and M32, and a voltage of 0 V is applied from the switching mechanism formation well wire PWL0 to the switching mechanism formation well PW0. Accordingly, the switching transistor 26c is turned on to electrically connect the first control line DL1 and the sub control line W21 and apply the charge storage prevention memory gate voltage applied to the first control line DL1 to the sub control line W21.

Accordingly, a voltage of −3 V is applied from the word line ROW00 to the source of the memory transistor F31 of the non-programming memory cell M31 sharing the word line ROW00 with the programming memory cell M11, and a voltage of −3 V is applied to the memory well MPW0. Simultaneously, a charge storage prevention memory gate voltage of 0 V is applied from the sub control line W21 to the gate of the memory transistor F31. As a result, the memory transistor F31 has a voltage difference small enough to prevent charge injection into the charge storage layer, thereby maintaining a no-data programmed state.

Simultaneously, a voltage of 0 V is applied from the word line ROW01 to the source of the memory transistor F32 of the non-programming memory cell M32 disposed in the memory unit 2c, and the charge storage prevention memory gate voltage applied to the first control line DL1 is applied to the gate of the memory transistor F32. Accordingly, in the memory transistor F32 of the non-programming memory cell M32, the voltage of −3 V is applied to the memory well MPW0, and the voltage of 0 V is applied to the source and gate, which achieves a voltage difference small enough to prevent charge injection into the charge storage layer, and thus a no-data programmed state is maintained.

In the memory unit 2d on the second row and the second column disposed on the first control line DL1 to which the charge storage prevention memory gate voltage is applied, a voltage of 0 V is applied from the word lines ROW10 and ROW11 to the sources of the memory transistors F41 and F42. In this memory unit 2d, an off voltage of 0 V is applied to the gate of the switching transistor 26d through the second control line HS1 to turn off the switching transistor 26d. Since a voltage of 0 V is also applied to the memory well MPW1 in the memory unit 2d, the memory transistors F41 and F42 each have a voltage difference of 0 V, which prevents charge injection into the charge storage layer, and thus a no-data programmed state is maintained.

In this manner, in the non-volatile semiconductor memory device 25, no data is programmed into the memory cell M12 in the memory unit 2a on the first row and the first column nor to the memory cells M21, M22, M31, M32, and M41, and M42 in the other memory units 2b, 2c, and 2d, whereas data is programmed only into the memory cell M11 in the memory unit 2a on the first row and the first column.

(2-2) Data Reading Operation

Figure 6:
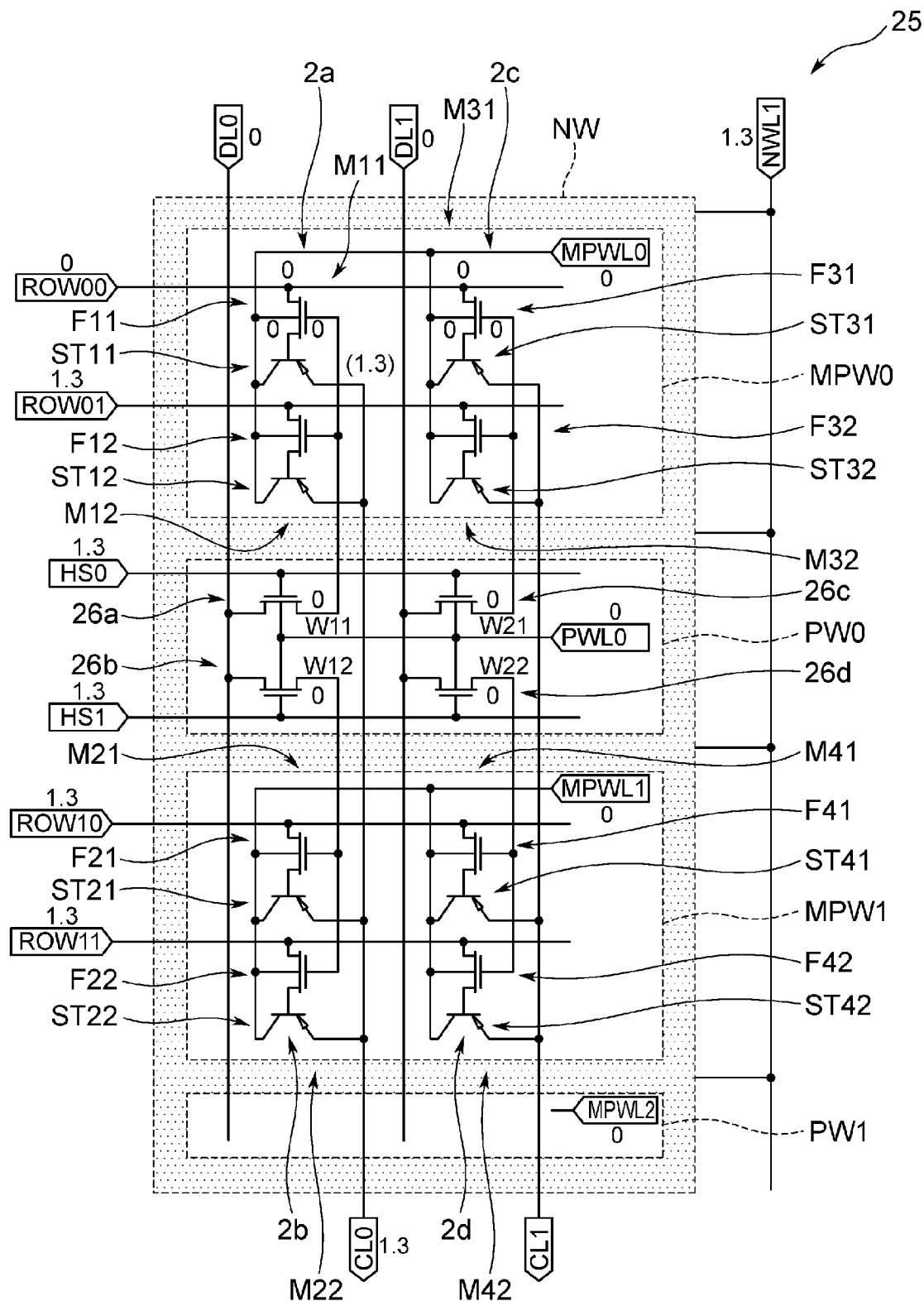
FIG. 6 is a schematic view illustrating voltage at each site in the circuit configuration of the non-volatile semiconductor memory device according to the first embodiment at data reading operation.

FIG. 6, in which any corresponding part to that in FIG. 3 is denoted by an identical reference sign, indicates voltage at each site when data is read from the memory cell M11 in the memory unit 2a on the first row and the first column but no data is read from the memory cell M12 on the second column in the memory unit 2a nor the memory cells M21, M22, M31, M32, M41, and M42 in the other memory units 2b, 2c, and 2d.

In this case, a voltage of 0 V is applied to the first control lines DL0 and DL1 and the memory well wires MPWL0 and MPWL1 in the non-volatile semiconductor memory device 25. In the memory cell (hereinafter also referred to as a reading memory cell) M11 from which data is read, a voltage of 0 V is applied to the word line ROW00 connected with the source of the memory transistor F11. Then, the bit line CL0 connected with the emitter of the switch transistor ST11 of the reading memory cell M11 is precharged at 1.3 V through an operation before data reading.

Simultaneously, an on voltage of 1.3 V is applied to the second control lines HS0 and HS1, and a voltage of 0 V is applied to the switching mechanism formation well PW0 from the switching mechanism formation well wire PWL0. Accordingly, the switching transistors 26a, 26b, 26c, and 26d are turned on to apply the voltage of 0 V applied to the first control lines DL0 and DL1 to the corresponding sub control lines W11, W12, W21, and W22. As a result, in the reading memory cell M11, a voltage of 0 V is applied to the gate of the memory transistor F11 in which a voltage of 0 V is applied to the source and the memory well MPW0.

In this case, when data is programmed into the memory transistor F11 of the reading memory cell M11, charge (electron) is stored in the charge storage layer. Accordingly, no current flows between the source and drain of the memory transistor F11, and thus the precharge voltage (1.3 V) applied to the bit line CL0 is maintained without changing.

When no data is programmed into the memory transistor F11 of the reading memory cell M11, no charge (electron) is stored in the charge storage layer. Accordingly, current flows between the source and drain of the memory transistor F11, and thus the bit line CL0 is electrically connected with the word line ROW00 at 0 V through the switch transistor ST11 and the memory transistor F11. Accordingly, the precharge voltage applied to the bit line CL0 through bipolar operation of the switch transistor ST11 is discharged toward a collector voltage of 0 V.

In the non-volatile semiconductor memory device 25 thus configured, it is possible to determine whether data is programmed into the memory transistor F11 of the reading memory cell M11 by sensing any change in the precharge voltage applied to the bit line CL0.

A voltage of 1.3 V is applied, through the word lines ROW01, ROW10, and ROW11, to the sources of the memory transistors F12, F21, and F22 of the memory cells (hereinafter also referred to as non-reading memory cells) M12, M21, and M22, from which no data is read, on a column same as that of the reading memory cell M11. Accordingly, the voltage values of the word lines ROW01, ROW10, and ROW11 are equal to the voltage value of the bit line CL0. Thus, when the bit line CL0 is connected with the word lines ROW01, ROW10, and ROW11 through the memory transistors F12, F21, and F22 in the non-reading memory cells M12, M21, and M22, the voltage value of the bit line CL0 does not change. Thus, in the bit line CL0 to which the precharge voltage is applied, the precharge voltage is not affected by the data programming states of the non-reading memory cells M12, M21, and M22. This configuration allows determination of whether data is programmed into the memory transistor F11 of the reading memory cell M11 based on any change in the precharge voltage. No precharge voltage is applied to the bit line CL1 on which only the non-reading memory cells M31, M32, M41, and M42 are disposed, and thus the data programming states of the non-reading memory cells M31, M32, M41, and M42 are not determined.

(2-3) Data Erasing Operation

Figure 7:
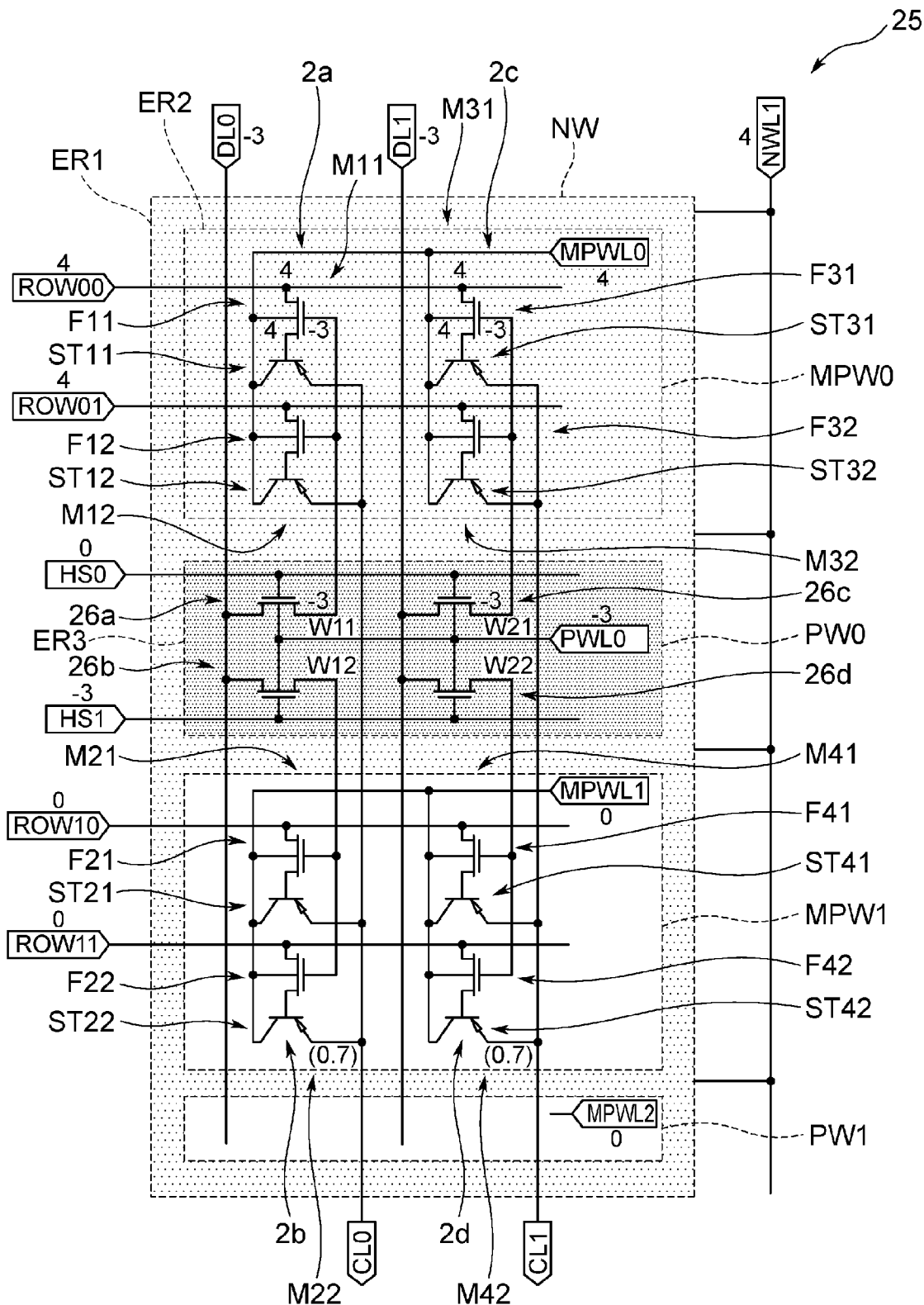
FIG. 7 is a schematic view illustrating voltage at each site in the circuit configuration of the non-volatile semiconductor memory device according to the first embodiment at data erasing operation.

FIG. 7, in which any corresponding part to that in FIG. 3 is denoted by an identical reference sign, indicates voltage at each site when data is collectively erased from all memory cells M11, M12, M31, and M32 disposed in the memory well MPW0 but data is maintained intact in the memory cells M21, M22, M41, and M42 disposed in the memory well MPW1. In this case, an erasing voltage of −3 V is applied from the first control lines DL0 and DL1 to the sources of the switching transistors 26a and 26c of the memory units 2a and 2c including the memory cells (hereinafter also referred to as erasing memory cells) M11, M12, M31, and M32 from which data is erased.

A voltage of 0 V is applied from the shared second control line HS0 to the gates of the switching transistors 26a and 26c connected with the erasing memory cells M11, M12, M31, and M32, and a voltage of −3 V, which is equal to the erasing voltage, is applied to the switching mechanism formation well PW0 through the well wire PWL0. Accordingly, the switching transistors 26a and 26c are turned on to apply the erasing voltage applied to the first control lines DL0 and DL1 to the corresponding sub control lines W11 and W21, and then the erasing voltage is applied to the gates of the memory transistors F11, F12, F31, and F32 through the sub control lines W11 and W21.

Simultaneously, a voltage of 4 V is applied to the word lines ROW00 and ROW01 disposed in the erasing memory cells M11, M12, M31, and M32, and a voltage of 4 V is applied, through the memory well wire MPWL0, to the memory well MPW0 in which the erasing memory cells M11, M12, M31, and M32 are disposed. Accordingly, the erasing voltage of −3 V applied to the first control lines DL0 and DL1 is applied, from the sub control lines W11 and W21 through the switching transistors 26a and 26c, to the gates of the memory transistors F11, F12, F31, and F32 disposed in the erasing memory cells M11, M12, M31, and M32. In addition, the voltage of 4 V is applied to the sources and the memory well MPW0 thereof. This configuration achieves a voltage difference large enough to cause the tunneling effect for removing charge from each charge storage layer, thereby achieving a data erased state.

An off voltage of −3 V is applied from the shared second control line HS1 to the gates of the switching transistors 26b and 26d disposed in the memory cells (hereinafter also referred to as non-erasing memory cells) M21, M22, M41, and M42 from which no data is erased. Accordingly, the switching transistors 26b and 26d, to the sources of which the erasing voltage of −3 V is applied from the first control lines DL0 and DL1, is turned off due to the off voltage applied to the gates thereof and blocks application of the erasing voltage from the first control lines DL0 and DL1 to the corresponding sub control lines W12 and W22.

In the non-erasing memory cells M21, M22, M41, and M42, a voltage of 0 V is applied to the sources of the memory transistors F21, F22, F41, and F42 through the word lines ROW10 and ROW11, and a voltage of 0 V is applied to the memory well MPW1 through the memory well wire MPWL1. Accordingly, in each of the memory transistors F21, F22, F41, and F42 of the non-erasing memory cells M21, M22, M41, and M42, the voltage difference between the gate and source and the voltage difference between the gate and the memory well MPW1 are reduced to maintain the state of charge storage in the charge storage layer and thus maintain the state of data intact without erasing.

In the non-erasing memory cells M21, M22, M41, and M42, since the switching transistors 26b and 26d are turned off to block application of the erasing voltage from the first control lines DL0 and DL1 to the corresponding sub control lines W12 and W22, the erasing voltage is not applied from the sub control lines W12 and W22 to the gates of the memory transistors F21, F22, F41, and F42. Thus, the occurrence of disturbance can be reduced at the memory transistors F21, F22, F41, and F42 by applying equivalent voltages to the word lines ROW10 and ROW11 and the memory well MPW1.

(2-4) Operations and Effects

In the non-volatile semiconductor memory device 25 having the above-described configuration, a charge storage memory gate voltage for achieving charge injection into the charge storage layer is applied to the first control line DL0 disposed in the programming memory cell M11 at the data programming operation. In this case, among the switching transistors 26a and 26b provided on the first control line DL0 in the non-volatile semiconductor memory device 25, the switching transistor 26a provided for the programming memory cell M11 is turned on by the switching gate voltage from the second control line HS0 to apply the charge storage memory gate voltage only to the sub control line W11 connected with the switching transistor 26a.

Simultaneously, in the non-volatile semiconductor memory device 25, the switching transistor 26b provided only for the non-programming memory cells M21 and M22 is turned off by the switching gate voltage from the second control line HS1 to block application of the charge storage memory gate voltage to the sub control line W12 connected with the switching transistor 26b.

Accordingly, in the non-volatile semiconductor memory device 25, the switching transistor 26b prevents application of the charge storage memory gate voltage applied to the first control line DL0 to the sub control line W12 when the data programming operation is repeated on the memory unit 2a. Thus, without consideration on the charge storage memory gate voltage, voltage values at the non-programming memory cells M21 and M22 provided on the sub control line W12 can be adjusted such that disturbance is unlikely to occur. Accordingly, the occurrence of disturbance at the non-programming memory cells M21 and M22 can be reduced.

As described above, in the non-volatile semiconductor memory device 25 according to the present invention, the memory cells M11, M12, M21, and M22 can be arranged in one direction along the first control line DL0. In addition, the occurrence of disturbance can be reduced at each of the memory units 2a and 2b. Accordingly, the occurrence rate of disturbance can be reduced as compared to conventional cases.

In the non-volatile semiconductor memory device 25 according to the present invention, for example, the sub control line W11 is provided as a connection wire connecting the memory transistors F11 and F12 and the first control line DL0. In addition, the sub control line W11 is directly disposed facing to the charge storage layers of the memory transistors F11 and F12 and provided as the gates of the memory transistors F11 and F12.

Accordingly, in the non-volatile semiconductor memory device 25, for example, the sub control line W11 as a connection wire connecting the memory transistors F11 and F12 and the switching transistor 26a, and the gates of the memory transistors F11 and F12 can be disposed in a single wiring layer. This configuration allows a simplified circuit configuration as compared to a case in which the gates of the memory transistors F11 and F12 and the sub control line W11 are disposed in separate wiring layers, thereby achieving downsizing accordingly.

At the data reading operation in the non-volatile semiconductor memory device 25, the bit lines CL0 and CL1 to which the precharge voltage is applied are directly connected with the switch transistors ST11, ST12, ST21, and ST22 of the memory cells M11, M12, M21, and M22 arranged along the first control lines DL0 and DL1, which avoids a hierarchized structure. In addition, the non-volatile semiconductor memory device 25 does not need to have address selectivity of selecting a memory cell column corresponding to each of the switching transistors 26a, 26b, 26c, and 26d at the data reading operation. Instead, the switching transistors 26a, 26b, 26c, and 26d are all turned on under identical operational conditions and have identical states of electrical connection with the corresponding sub control lines W11, W12, W21, and W22.

At the data reading operation in the non-volatile semiconductor memory device 25, the voltage of 0 V is supplied from the switching transistors 26a, 26b, 26c, and 26d to the corresponding sub control lines W11, W12, W21, and W22. Thus, effectively no charging and discharging are performed at the memory transistor F11 and the like, and a data reading time is not affected by switching operation of the switching transistors 26a, 26b, 26c, and 26d. In this manner, the switching transistors 26a, 26b, 26c, and 26d each have such a characteristic that the occurrence rate of disturbance can be reduced at the data programming operation due to hierarchization of the corresponding memory cell columns. In addition, the switching transistors 26a, 26b, 26c, and 26d each have a data reading characteristic equivalent to that of a configuration not including the switching transistors 26a, 26b, 26c, and 26d because this hierarchized structure does not affect the data reading operation at all.

In addition, since the switching transistors 26a, 26b, 26c, and 26d do not selectively turn on and off the memory cell columns at the data reading operation, the turning on and off operation is not needed when the address of a memory cell column to be read is switched at each data reading cycle. Accordingly, charging and discharging are not performed at the memory transistor F11 or the like at each data reading cycle, and thus the reading speed is not affected by the element performance of the switching transistors 26a, 26b, 26c, and 26d. As a result, fast operation is not required at the switching transistors 26a, 26b, 26c, and 26d, which leads to reduction in the sizes of the switching transistors 26a, 26b, 26c, and 26d and the sizes of control circuits thereof.

Switching mechanisms in the non-volatile semiconductor memory device 25 are the switching transistors 26a, 26b, 26c, and 26d each having a MOS structure of a conductivity type same as those of the memory transistors F11, F12, F21, F22, F31, F32, F41, and F42 of the memory cells M11, M12, M21, M22, and M31, M32, M41, and M42. This configuration allows the data reading operation to be performed by a single power source, thereby achieving a simplified circuit configuration.

According to the above-described configuration, while voltage applied from the first control line DL0 is applied, as a memory gate voltage, to the sub control line W11 through the switching transistor 26a, the switching transistor 26b can block voltage application to the corresponding sub control line W12. Thus, while the memory cells M11, M12, M21, and M22 are arranged in one direction along the first control line DL0, the switching transistor 26b can prevent application of the memory gate voltage to the memory cells M21 and M22, thereby reducing the occurrence of disturbance accordingly. The sub control line W11 to which the memory gate voltage is applied from the first control line DL0 is used as the gates of the memory transistors F11 and F12, and thus the sub control line W11 and the gates can be disposed in a single wiring layer, thereby achieving downsizing as compared to a case in which the sub control line W11 and the gates are disposed in separate wiring layers.

(3) Non-Volatile Semiconductor Memory Device According to Second Embodiment

Figure 8:
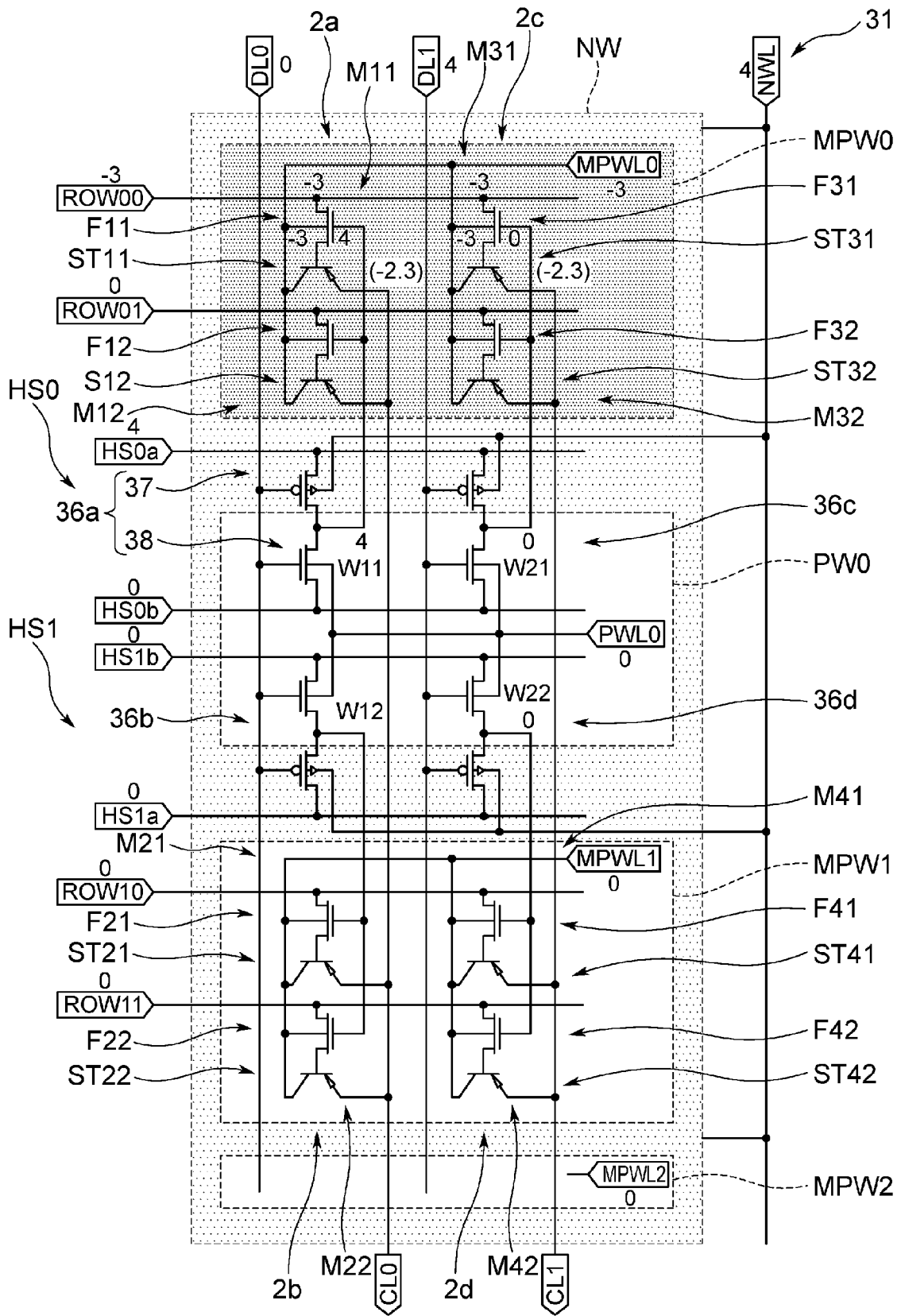
FIG. 8 is a schematic view illustrating voltage at each site in a circuit configuration of a non-volatile semiconductor memory device according to a second embodiment at data programming operation.

In FIG. 8, in which any corresponding part to that in FIG. 3 is denoted by an identical reference sign, 31 denotes a non-volatile semiconductor memory device according to the second embodiment. Unlike the non-volatile semiconductor memory device 25 according to the first embodiment described above, the switching gate voltage is applied to the first control lines DL0 and DL1, and the memory gate voltage is applied to the second control lines HS0 and HS1. The second control line HS0 (HS1) of the non-volatile semiconductor memory device 31 includes a first memory gate line HS0a (HS1a) and a second memory gate line HS0b (HS1b). The first memory gate line HS0a (HS1a) and the second memory gate line HS0b (HS1b) are connected with switching mechanisms 36a and 36c (36b and 36d) arranged in the row direction.

The switching mechanisms 36a, 36b, 36d, and 36d have identical complementary MOS (CMOS) structures. For example, the switching mechanism 36a is connected with one end of a P-type MOS transistor 37 and one end of an N-type MOS transistor 38. The P-type MOS transistor 37 and the N-type MOS transistor 38 are connected in series.

In this case, the switching mechanisms 36a and 36c arranged in the row direction share a pair of the first memory gate line HS0a and the second memory gate line HS0b to receive uniform voltage application through the first memory gate line HS0a and the second memory gate line HS0b. The switching mechanisms 36b and 36d arranged in the row direction share a pair of the first memory gate line HS1a and the second memory gate line HS1b to receive uniform voltage application through the first memory gate line HS1a and the second memory gate line HS1b.

The switching mechanisms 36a and 36b arranged in the column direction share the first control line DL0 to receive uniform voltage application through the first control line DL0. The switching mechanisms 36c and 36d arranged in the column direction share the first control line DL1 to receive uniform voltage application through the first control line DL1.

In this case, in the switching mechanism 36a, the other end of the P-type MOS transistor 37 is connected with the first memory gate line HS0a and the other end of the N-type MOS transistor 38 is connected with the second memory gate line HS0b. The gate of the P-type MOS transistor 37 and the gate of the N-type MOS transistor 38 in the switching mechanism 36a are connected with the first control line DL0 to receive uniform voltage application from the first control line DL0.

In addition to the above-described configuration, the one end of the P-type MOS transistor 37 and the one end of the N-type MOS transistor 38 in the switching mechanism 36a are connected with the sub control line W11. When one of the P-type MOS transistor 37 and the N-type MOS transistor 38 is turned on, the memory gate voltage applied to any one of the first memory gate line HS0a and the second memory gate line HS0b is applied to the sub control line W11.

The P-type MOS transistor 37 provided to each of the switching mechanisms 36a, 36b, 36c, and 36d is disposed in the N-type well NW separating the P-type memory well MPW0 and the P-type switching mechanism formation well PW0. The well NW in which the P-type MOS transistor 37 is disposed receives voltage application through a well wire NWL. The N-type MOS transistor 38 provided to each of the switching mechanisms 36a, 36b, 36c, and 36d is disposed in the switching mechanism formation well PW0. In this configuration, the N-type MOS transistors 38 of the four switching mechanisms 36a, 36b, 36c, and 36d adjacent to each other in a matrix of rows and columns are disposed in the switching mechanism formation well PW0. The P-type MOS transistors 37 of the switching mechanisms 36a, 36b, 36c, and 36d are disposed in the well NW around the switching mechanism formation well PW0 adjacent to the corresponding N-type MOS transistors 38. The switching mechanism formation well PW0, in which the N-type MOS transistors 38 are disposed, receives uniform voltage application through the switching mechanism formation well wire PWL0.

In the non-volatile semiconductor memory device 31, too, similarly to the first embodiment described above, the sub control lines W11, W12, W21, and W22 are provided as connection wires for applying the memory gate voltage applied to the second control lines HS0 and HS1 to the memory cells M11, M12, M21, M22, and M31, M32, M41, and M42. The sub control lines W11, W12, W21, and W22 are directly disposed facing to the charge storage layers of the corresponding memory transistors F11, F12, F21, F22, F31, F32, F41, and F42 and provided as the gates of the memory transistors F11, F12, F21, F22, F31, F32, F41, and F42. With this configuration, the non-volatile semiconductor memory device 31 can have a simplified circuit configuration as compared to a case in which, for example, the gates of the memory transistors F11 and F12 are separately provided in wiring layers in regions different from that of the sub control line W11 as a connection wire connecting the memory transistors F11 and F12 and the switching mechanism 36a. Accordingly, the non-volatile semiconductor memory device 31 can achieve downsizing.

Figure 9:
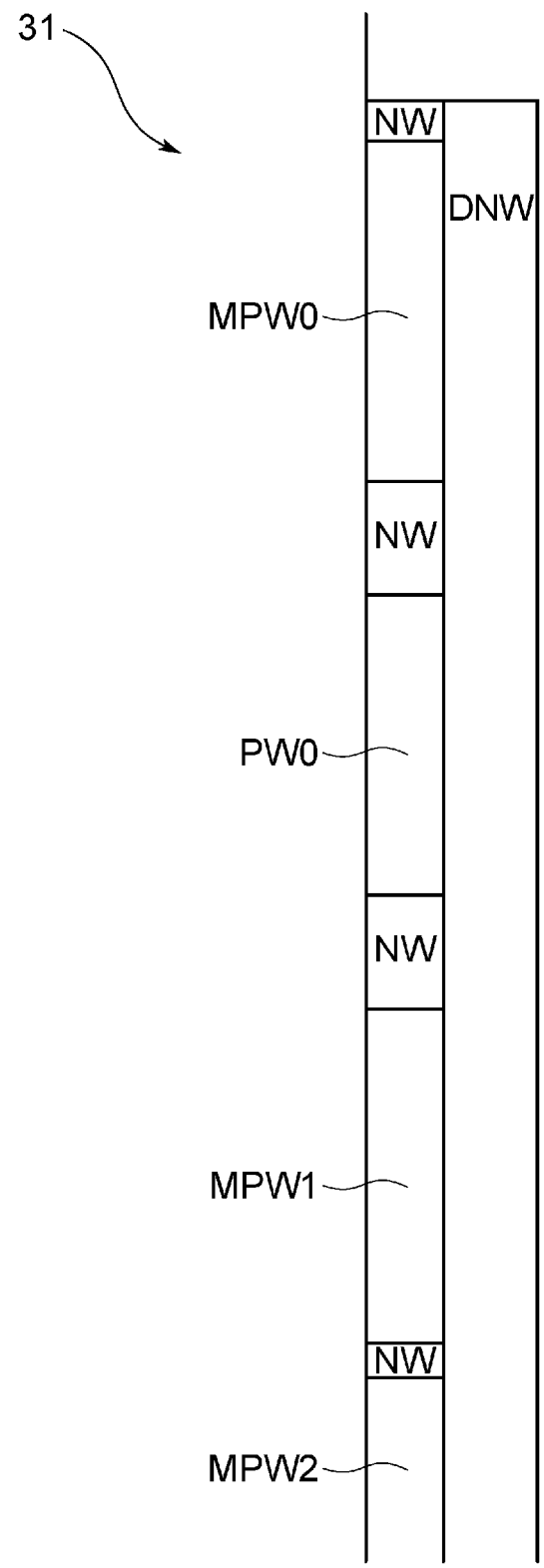
FIG. 9 is a schematic view illustrating the configurations of a memory well, a switching mechanism formation well, and a well disposed on a deep well in the non-volatile semiconductor memory device according to the second embodiment.

As illustrated in FIG. 9, in which any corresponding part to that in FIG. 4 is denoted by an identical reference sign, in the non-volatile semiconductor memory device 31, too, the memory wells MPW0, MPW1, and MPW2 and the switching mechanism formation well PW0 are disposed on the N-type deep well DNW. In this configuration, the deep well DNW and the well NW electrically insulate the memory wells MPW0, MPW1, and MPW2 from the switching mechanism formation well PW0. The following sequentially describes data programming operation, data reading operation, and data erasing operation of the non-volatile semiconductor memory device 31 having such a configuration.

(3-1) Data Programming Operation

FIG. 8 indicates voltage at each site when data is programmed into the memory cell M11 in the memory unit 2a on the first row and the first column but no data is programmed into the memory cell M12 in the memory unit 2a nor the memory cells M21, M22, M31, M32, and M41, and M42 in the other memory units 2b, 2c, and 2d. In this case, a charge storage memory gate voltage of 4 V is applied to the first memory gate line HS0a of the second control line HS0 on which the programming memory cell M11 is disposed, and a charge storage prevention memory gate voltage of 0 V is applied to the second memory gate line HS0b of the second control line HS0.

An on voltage of 0 V for the P-type MOS transistor 37 is applied, as a switching gate voltage, to the switching mechanism 36a provided for the programming memory cell M11 through the first control line DL0. This on voltage is applied to the gates of the P-type MOS transistor 37 and the N-type MOS transistor 38. Accordingly, in the switching mechanism 36a, the P-type MOS transistor 37 is turned on by a voltage difference between the first memory gate line HS0a and the first control line DL0, and the N-type MOS transistor 38 is turned off by a voltage difference between the second memory gate line HS0b and the first control line DL0.

As a result, the switching mechanism 36a applies the charge storage memory gate voltage of 4 V applied to the first memory gate line HS0a to the corresponding sub control line W11 through the P-type MOS transistor 37. Simultaneously, the N-type MOS transistor 38 of the switching mechanism 36a, which is being turned off, blocks voltage application from the second memory gate line HS0b to the sub control line W11.

In the programming memory cell M11, the charge storage memory gate voltage applied to the sub control line W11 from the first memory gate line HS0a of the second control line HS0 through the switching mechanism 36a is applied to the gate of the memory transistor F11. In this case, in the non-volatile semiconductor memory device 31 according to the second embodiment, the charge storage memory gate voltage of 4 V applied to the first memory gate line HS0a is not reduced through the switching mechanism 36a and is applied intact to the sub control line W11.

In the non-volatile semiconductor memory device 25 according to the first embodiment illustrated in FIG. 3 described above, the switching gate voltage needs to be increased by Vth V, which is to be reduced through the switching transistor 26a. In the non-volatile semiconductor memory device 31 according to the second embodiment, however, the switching gate voltage applied from the first control line DL0 to the switching mechanism 36a does not need to be equal to or larger than the charge storage memory gate voltage applied to the second control line HS0 at the data programming operation, unlike the non-volatile semiconductor memory device 25 according to the first embodiment.

Simultaneously, a voltage of −3 V is applied to the word line (select word line) ROW00 connected with the source of the memory transistor F11 of the programming memory cell M11, and a voltage of −3 V is applied to the memory well MPW0 in which the programming memory cell M11 is provided through the memory well wire MPWL0. Accordingly, in the memory transistor F11 of the programming memory cell M11, charge is injected into the charge storage layer through the source due to the tunneling effect caused by a voltage difference (7 V) between the voltage (−3 V) applied to the memory well MPW0 and the source and the charge storage memory gate voltage (4 V) applied to the gate, thereby achieving a data programmed state.

A voltage of 4 V in accordance with the charge storage memory gate voltage applied to the first memory gate line HS0a is applied to the well NW, which surrounds the memory wells MPW0 and MPW1 and the switching mechanism formation well PW0 and in which the P-type MOS transistors 37 of the switching mechanisms 36a, 36b, 36c, and 36d are disposed.

The memory well wire MPWL0 to which a voltage of −3 V is applied is also connected with the collectors of the switch transistors ST11 and ST12 of the memory unit 2a including the programming memory cell M11. Thus, the voltage of −3 V is applied to the collectors of the switch transistors ST11 and ST12. In the memory unit 2a including the programming memory cell M11, the memory transistor F11 is turned on and the voltage of −3 V applied to the select word line ROW00 is applied to the drain of the memory transistor F11. Accordingly, the base of the switch transistor ST11 is at −3 V, and the bit line CL0 is at −2.3 V, which is larger by a built-in voltage.

Simultaneously, in the memory cell (non-programming memory cell) M12 into which data is not programmed in the memory unit 2a including the programming memory cell M11, a voltage of 0 V is applied to the non-select word line ROW01 connected with the source of the memory transistor F12. Accordingly, in the non-programming memory cell M12 in the memory unit 2a including the programming memory cell M11, the source of the memory transistor F12 is at 0 V while the charge storage memory gate voltage of 4 V is applied to the gate of the memory transistor F12 from the first memory gate line HS0a through the switching mechanism 36a and the sub control line W11. As a result, the voltage difference between the source and gate is small enough to reduce charge injection into the charge storage layer, thereby maintaining a no-data programmed state.

The following describes the memory unit 2b sharing the first control line DL0 with the memory unit 2a including the programming memory cell M11. In the memory unit 2b, a PMOS on voltage of 0 V is applied to the switching mechanism 36b from the first control line DL0 shared with the memory unit 2a including the programming memory cell M11. Simultaneously, a charge storage prevention memory gate voltage of 0 V is applied to the first memory gate line HS1a and the second memory gate line HS1b of the second control line HS1 on which only the non-programming memory cells M21, M22, M41, and M42 into which data is not programmed are disposed. This operation leaves the voltage of the sub control line W12 unset. Thus, the potentials of the sub control lines W11, W12, W21, and W22 are set to the charge storage prevention memory gate voltage of 0 V in advance before the data programming operation is started.

Accordingly, the on voltage of 0 V is applied, through the first control line DL0, to the gate of the P-type MOS transistor 37 of the switching mechanism 36b connected with the second control line HS1, and a voltage of 0 V is applied to the other end of the P-type MOS transistor 37 through the first memory gate line HS1a. As a result, the P-type MOS transistor 37 is turned off. Simultaneously, an NMOS off voltage of 0 V is applied from the first control line DL0 to the gate of the N-type MOS transistor 38 of the switching mechanism 36b, and a voltage of 0 V is applied from the second memory gate line HS1b to the other end of the N-type MOS transistor 38. As a result, the N-type MOS transistor 38 is turned off. Accordingly, voltage application from the switching mechanism 36b to the sub control line W12 connected with the switching mechanism 36b is blocked.

In addition, a voltage of 0 V is applied to the sources of the memory transistors F21 and F22 of the non-programming memory cells M21 and M22 through the word lines ROW10 and ROW11, and a voltage of 0 V is applied, through the memory well wire MPWL1, to the memory well MPW1 only including the non-programming memory cells M21, M22, M41, and M42. Accordingly, in each of the memory transistors F21 and F22 of the non-programming memory cells M21 and M22, the voltage difference between the gate and the memory well MPW1 and the voltage difference between the gate and source is 0 V so that no charge is injected into the charge storage layers of the memory transistors F21 and F22, and thus a no-data programmed state is maintained. In this case, too, similarly to the above-described case, in each of the switch transistors ST21 and ST22, the bit line CL0 connected with the emitter is at −2.3 V through the above-described operation, and the base voltage only takes a negative value obtained by subtracting the threshold voltages of the memory transistors F21 and F22 from the voltage of 0 V applied to the word lines ROW10 and ROW11. Accordingly, the switch transistors ST21 and ST22 are each turned off with no current flowing between the emitter and base.

As described above, in the memory unit 2a including the programming memory cell M11, the charge storage memory gate voltage applied to the second control line HS0 (first memory gate line HS0a) is applied to the memory transistor F12 of the non-programming memory cell M12 through the switching mechanism 36a, which causes a slight voltage difference in the memory transistor F12 of the non-programming memory cell M12. Thus, in the non-programming memory cell M12 in the memory unit 2a including the programming memory cell M11, when the charge storage memory gate voltage is repeatedly applied to the sub control line W11 due to repetition of the data programming operation on the programming memory cell M11 sharing the sub control line W11, disturbance is likely to occur.

However, in the memory unit 2b only including the non-programming memory cells M21 and M22 and disposed along the first control line DL0, on which the memory unit 2a including the programming memory cell M11 is disposed, the charge storage memory gate voltage applied to the programming memory cell M11 is not applied to the non-programming memory cells M21 and M22, which significantly reduces voltage differences at the memory transistors F21 and F22 and thus prevents occurrence of disturbance.

In this manner, in the non-volatile semiconductor memory device 31 according to the present invention including the memory cells M11, M12, M21, and M22 arranged in one direction like conventional cases, occurrence of disturbance is prevented in the memory cells M21 and M22 of the memory unit 2b sharing the first control line DL0 with the memory unit 2a including the programming memory cell M11, and accordingly, overall generation of disturbance is reduced as compared to conventional cases.

The following describes the memory unit 2c on the first row and the second column, which shares the second control line HS0 with the memory unit 2a including the programming memory cell M11 and only includes the non-programming memory cells M31 and M32. In the non-volatile semiconductor memory device 31, the second control line HS0 is shared by the switching mechanism 36a provided for the programming memory cell M11 and the switching mechanism 36c provided only for the non-programming memory cells M31 and M32. Thus, a voltage of 4 V is applied from the first memory gate line HS0a to the other end of the P-type MOS transistor 37 of the switching mechanism 36c, and a voltage of 0 V is applied from the second memory gate line HS0b to the other end of the N-type MOS transistor 38 of the switching mechanism 36c.

Simultaneously, a voltage of 4 V is applied, as a switching gate voltage, to the first control line DL1 on which only the non-programming memory cells M31, M32, M41, and M42 are disposed. Accordingly, the voltage of 4 V is applied from the first control line DL1 to the gates of the P-type MOS transistor 37 and the N-type MOS transistor 38 of the switching mechanism 36c on the other column sharing the second control line HS0 to which a charge storage memory gate voltage is applied.

As a result, the P-type MOS transistor 37 of the switching mechanism 36c is turned off by a voltage difference between the first memory gate line HS0a and the first control line DL1 and blocks application of the charge storage memory gate voltage from the first memory gate line HS0a to the sub control line W21. The N-type MOS transistor 38 in a pair with the P-type MOS transistor 37 in the switching mechanism 36c is turned on by a voltage difference between the second memory gate line HS0b and the first control line DL1 and applies a charge storage prevention memory gate voltage applied to the second memory gate line HS0b to the sub control line W21.

Accordingly, the voltage of −3 V is applied from the word line ROW00 to the source of the memory transistor F31 of the non-programming memory cell M31 sharing the word line ROW00 with the programming memory cell M11, and also to the memory well MPW0. Simultaneously, the charge storage prevention memory gate voltage of 0 V is applied to the gate of the memory transistor F31 from the sub control line W21. As a result, the memory transistor F31 has a voltage difference small enough to prevent charge injection into the charge storage layer, thereby maintaining a no-data programmed state.

A voltage of 0 V is applied, through the word line ROW01, to the source of the memory transistor F32 of the non-programming memory cell M32 disposed in the memory unit 2c, and the charge storage prevention memory gate voltage is applied from the sub control line W21 to the gate of the memory transistor F32. Accordingly, in the memory transistor F32 of the non-programming memory cell M32, the voltage of −3 V is applied to the memory well MPW0, and the voltage of 0 V is applied to the source and gate, which achieves a voltage difference small enough to prevent charge injection into the charge storage layer, and thus a no-data programmed state is maintained.

A voltage of 4 V is applied, as a switching gate voltage, through the first control line DL1 to the gates of the P-type MOS transistor 37 and the N-type MOS transistor 38 of the switching mechanism 36d in the memory unit 2d on the second row and the second column. A voltage of 0 V is applied to the other end of the P-type MOS transistor 37 of the switching mechanism 36d through the first memory gate line HS1a, and a voltage of 0 V is applied to the other end of the N-type MOS transistor 38 through the second memory gate line HS1b.

Accordingly, the P-type MOS transistor 37 of the switching mechanism 36d is turned off by a voltage difference between the first control line DL1 and the first memory gate line HS1a and blocks voltage application from the first memory gate line HS1a to the sub control line W22. The N-type MOS transistor 38 of the switching mechanism 36d is turned on by a voltage difference between the first control line DL1 and the second memory gate line HS1b, and electrically connects the second memory gate line HS1b and the sub control line W22 so that the sub control line W22 is at 0 V. Simultaneously, the voltage of 0 V applied to the word lines ROW10 and ROW11 is applied to the sources of the memory transistors F41 and F42 of the memory unit 2d, and a voltage of 0 V is applied to the memory well MPW1.

Accordingly, in each of the memory transistors F41 and F42 disposed in the memory unit 2d, no voltage difference occurs between the memory well MPW1 and gate nor between the source and gate, and thus no charge is injected into the charge storage layer, thereby maintaining a no-data programmed state.

As a result, in the non-volatile semiconductor memory device 31, no data is programmed into the memory cell M12 in the memory unit 2a on the first row and the first column nor to the memory cells M21, M22, M31, M32, M41, and M42 in the other memory units 2b, 2c, and 2d, but data is programmed only into the memory cell M11 in the memory unit 2a on the first row and the first column.

(3-2) Data Reading Operation

Figure 10:
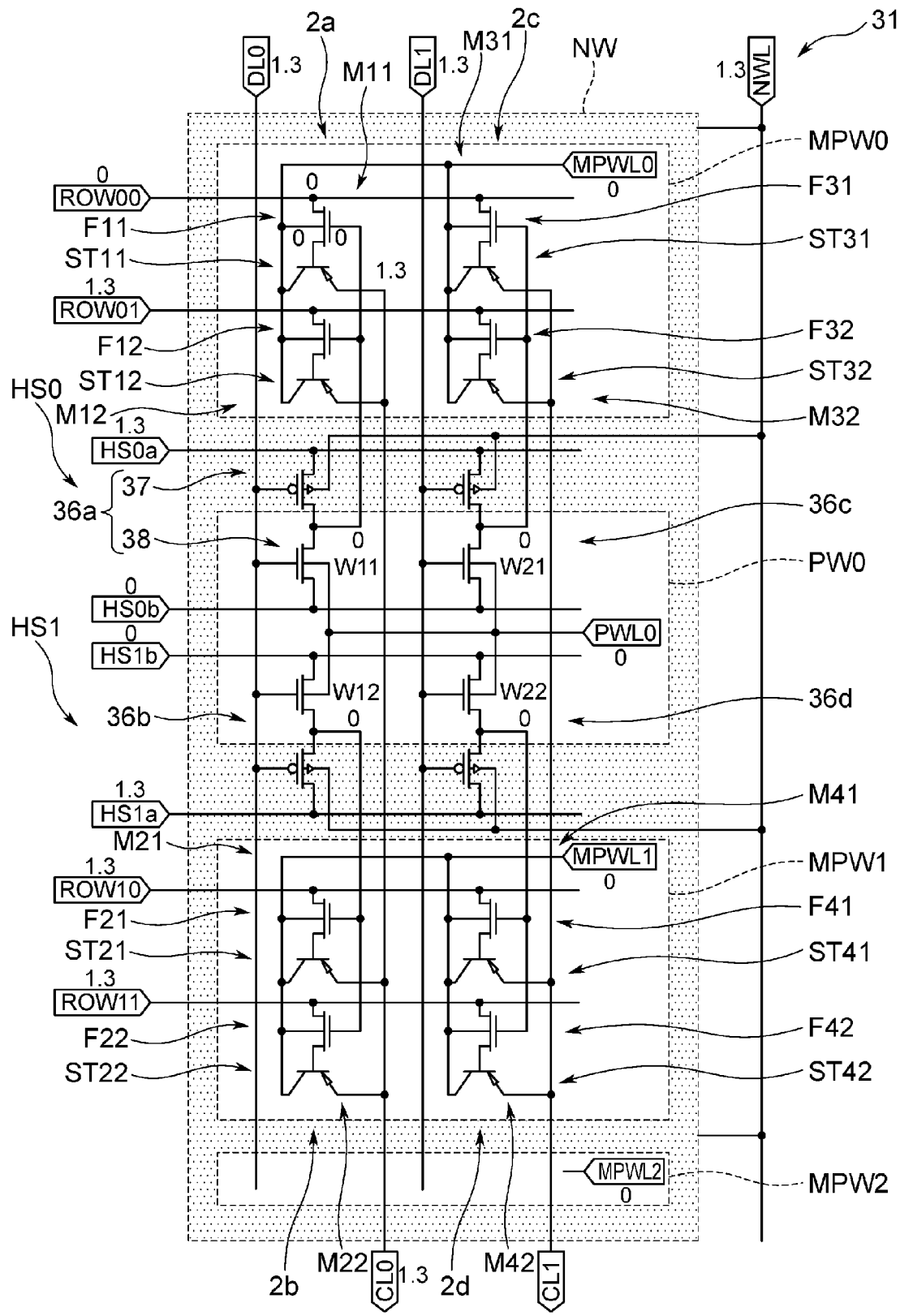
FIG. 10 is a schematic view illustrating voltage at each site in the circuit configuration of the non-volatile semiconductor memory device according to the second embodiment at data reading operation.

FIG. 10, in which any corresponding part to that in FIG. 8 is denoted by an identical reference sign, indicates voltage at each site in the non-volatile semiconductor memory device 31 when data is read from the memory cell M11 in the memory unit 2a on the first row and the first column but no data is read from the memory cell M12 in the memory unit 2a nor the memory cells M21, M22, M31, M32, M41, and M42 in the other memory units 2b, 2c, and 2d.

In this case, in the non-volatile semiconductor memory device 31, a voltage of 1.3 V is applied to the first control lines DL0 and DL1, and a voltage of 0 V is applied to all memory well wires MPWL0, MPWL1, and MPWL2 and the well wire PWL0. A voltage of 0 V is applied to the word line ROW00 connected with the source of the memory transistor F11 of the memory cell (reading memory cell) M11 from which data is read. The bit line CL0 connected with the emitter of the switch transistor ST11 of the reading memory cell M11 is precharged at 1.3 V through an operation before data reading.

Simultaneously, a voltage of 1.3 V is applied to the first memory gate line HS0a (HS1a) of the second control line HS0 (HS1), and a voltage of 0 V is applied to the second memory gate line HS0b (HS1b). Accordingly, in each of the switching mechanisms 36a, 36b, 36c, and 36d, the P-type MOS transistor 37 is turned off to block voltage application of 1.3 V from the first memory gate lines HS0a and HS1a to the corresponding sub control lines W11, W12, W21, and W22, and the N-type MOS transistor 38 is turned on to apply the voltage of 0 V applied to the second memory gate lines HS0b and HS1b to the corresponding sub control lines W11, W12, W21, and W22.

Accordingly, in the reading memory cell M11, the voltage of 0 V is applied to the gate of the memory transistor F11 in which the voltage of 0 V is applied to the source and the memory well MPW0. Simultaneously, when data is programmed into the memory transistor F11 of the reading memory cell M11, charge (electron) is stored in the charge storage layer. Accordingly, no current flows between the source and drain of the memory transistor F11, and thus the precharge voltage (1.3 V) applied to the bit line CL0 is maintained without changing.

When no data is programmed into the memory transistor F11 of the reading memory cell M11, no charge (electron) is stored in the charge storage layer. Accordingly, current flows between the source and drain of the memory transistor F11, and thus the bit line CL0 is electrically connected with the word line ROW00 at 0 V through the switch transistor ST11 and the memory transistor F11. Accordingly, the precharge voltage applied to the bit line CL0 through bipolar operation of the switch transistor ST11 is discharged toward a collector voltage of 0 V.

In the non-volatile semiconductor memory device 31 thus configured, too, it is possible to determine whether data is programmed into the memory transistor F11 of the reading memory cell M11 by sensing any change in the precharge voltage applied to the bit line CL0.

A voltage of 1.3 V is applied, through the word lines ROW01, ROW10, and ROW11, to the sources of the memory transistors F12, F21, and F22 of the memory cells (non-reading memory cell) M12, M21, and M22, which are disposed on a column same as that of the reading memory cell M11 and from which no data is to be read. Accordingly, the voltage values of the word lines ROW01, ROW10, and ROW11 are equal to the voltage value of the bit line CL0. Thus, when the bit line CL0 is connected with the word lines ROW01, ROW10, and ROW11 through the memory transistors F12, F21, and F22, the bipolar switch transistors ST12, ST21, and ST22 of the non-reading memory cells M12, M21, and M22 are turned off, and the voltage value of the bit line CL0 does not change. Thus, in the bit line CL0 to which the precharge voltage is applied, the precharge voltage is not affected by the data programming states of the non-reading memory cells M12, M21, and M22. This configuration allows determination of whether data is programmed into the memory transistor F11 of the reading memory cell M11 based on any change in the precharge voltage. No precharge voltage is applied to the bit line CL1 on which only the non-reading memory cells M31, M32, M41, and M42 are disposed, and thus the data programming states of the non-reading memory cells M31, M32, M41, and M42 are not determined.

(3-3) Data Erasing Operation

Figure 11:
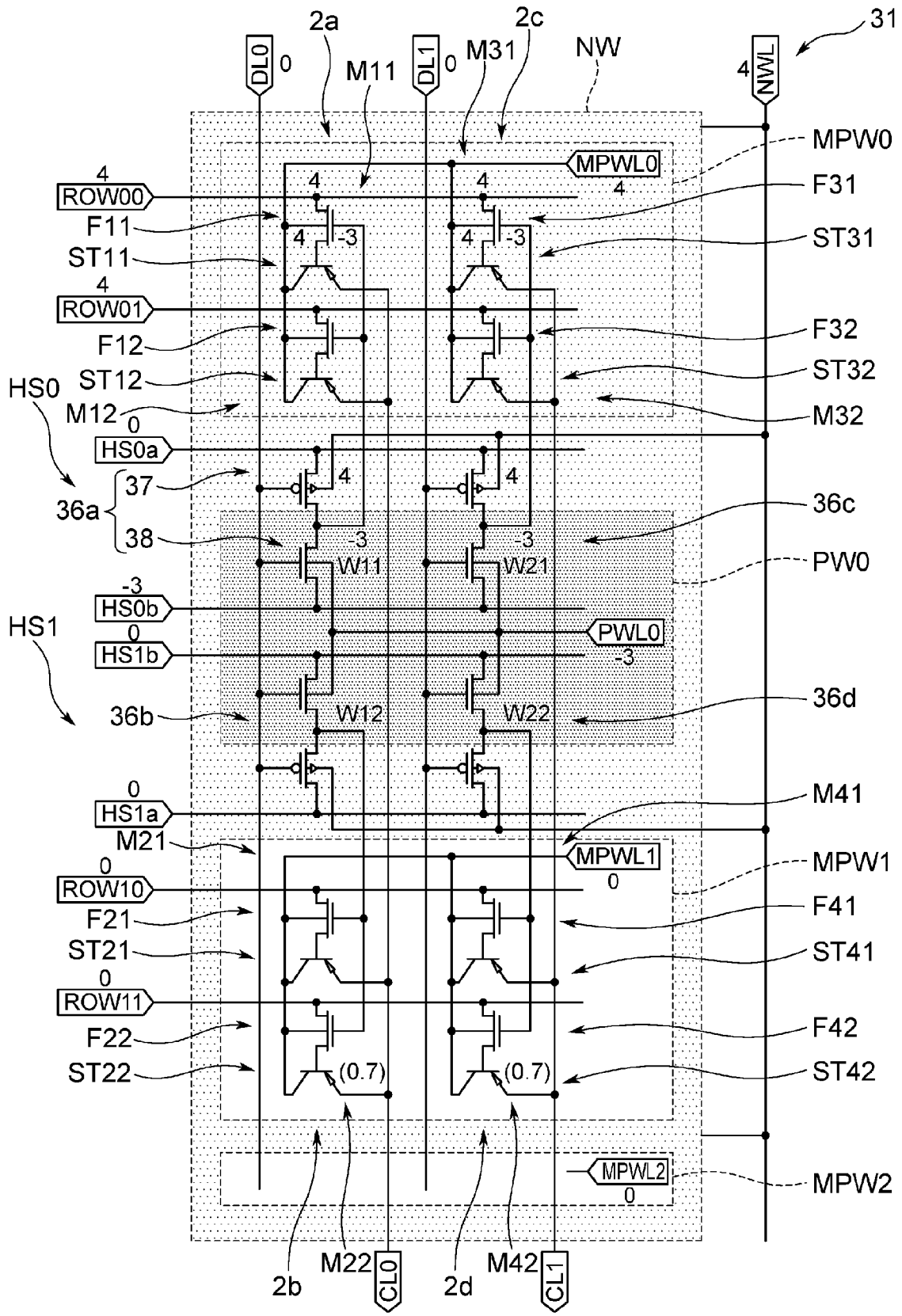
FIG. 11 is a schematic view illustrating voltage at each site in the circuit configuration of the non-volatile semiconductor memory device according to the second embodiment at data erasing operation.

FIG. 11, in which any corresponding part to that in FIG. 8 is denoted by an identical reference sign, indicates voltage at each site when data is collectively erased from all memory cells M11, M12, M31, and M32 disposed in the memory well MPW0 but data is maintained intact in the memory cells M21, M22, M41, and M42 disposed in the memory well MPW1.

In this case, in the memory units 2a and 2c including the memory cells (erasing memory cells) M11, M12, M31, and M32 from which data is erased, a non-erasing voltage of 0 V is applied from the first memory gate line HS0a of the second control line HS0 to the P-type MOS transistors 37 of the switching mechanisms 36a and 36c, and an erasing voltage of −3 V is applied from the second memory gate line HS0b of the second control line HS0 to the N-type MOS transistors 38 of the switching mechanisms 36a and 36c. A voltage of 0 V is applied, as a switching gate voltage, to the first control lines DL0 and DL1, and a voltage of −3 V, which is equal to the erasing voltage, is applied to the switching mechanism formation well PW0 through the well wire PWL0.

Accordingly, in the switching mechanisms 36a and 36c to which the erasing voltage is applied through the second control line HS0, the P-type MOS transistors 37 are turned off by voltage differences between the first memory gate line HS0a and the first control lines DL0 and DL1, respectively, and block voltage application from the first memory gate line HS0a to the sub control lines W11 and W21. In the switching mechanisms 36a and 36c, the N-type MOS transistors 38 are turned on by voltage differences between the second memory gate line HS0b and the first control lines DL0 and DL1, respectively, and apply the erasing voltage of −3 V applied to the second memory gate line HS0b to the corresponding sub control lines W11 and W21, respectively.

Simultaneously, a voltage of 4 V is applied to the word lines ROW00 and ROW01 disposed in the erasing memory cells M11, M12, M31, and M32, and a voltage of 4 V is applied, through the memory well wire MPWL0, to the memory well MPW0 in which the erasing memory cells M11, M12, M31, and M32 are disposed. Accordingly, in the memory transistors F11, F12, F31, and F32 disposed in the erasing memory cells M11, M12, M31, and M32, the erasing voltage of −3 V applied to the second memory gate line HS0b is applied to the sub control lines W11 and W21 serving as gates through the switching mechanisms 36a and 36c. In addition, the voltage of 4 V is applied to the sources and the memory well MPW0 thereof. This configuration achieves a voltage difference large enough to cause the tunneling effect for removing charge from each charge storage layer, thereby achieving a data erased state.

In the switching mechanisms 36b and 36d provided for the non-erasing memory cells M21, M22, M41, and M42, the voltage of 0 V is applied to the gates of the P-type MOS transistors 37 and the N-type MOS transistors 38 through the first control lines DL0 and DL1 shared with the switching mechanisms 36a and 36c on the other row. A voltage of 0 V is applied from the first memory gate line HS1a and the second memory gate line HS1b of the second control line HS1 to the P-type MOS transistors 37 and the N-type MOS transistors 38.

Accordingly, in the switching mechanisms 36b and 36d, the P-type MOS transistors 37 are turned off by voltage differences between the first memory gate line HS1a and the first control lines DL0 and DL1, respectively, and the N-type MOS transistors 38 are turned off by voltage differences between the second memory gate line HS1b and the first control lines DL0 and DL1, respectively. As a result, voltage application from the second control line HS1 to the corresponding sub control lines W12 and W22 is blocked.

In the non-erasing memory cells M21, M22, M41, and M42, a voltage of 0 V is applied to the sources of the memory transistors F21, F22, F41, and F42 through the word lines ROW10 and ROW11, and a voltage of 0 V is applied to the memory well MPW1 through the memory well wire MPWL1. Accordingly, in the memory transistors F21, F22, F41, and F42 of the non-erasing memory cells M21, M22, M41, and M42, no voltage difference occurs between the gate and source nor between the gate and the memory well MPW1, which maintains the state of charge storage in each charge storage layer, and thus maintains the state of data intact without erasing.

The switching mechanisms 36b and 36d in the non-erasing memory cells M21, M22, M41, and M42 are turned off to block voltage application from the second control line HS1 to the corresponding sub control lines W12 and W22, and thus no voltage is applied from the sub control lines W12 and W22 to the gates of the memory transistors F21, F22, F41, and F42. Thus, in the non-erasing memory cells M21, M22, M41, and M42, the occurrence of disturbance can be reduced at the memory transistors F21, F22, F41, and F42 by applying equivalent voltages to the word lines ROW10 and ROW11 and the memory well MPW1.

A voltage of 4 V in accordance with the word lines ROW00 and ROW01 and the memory well MPW0 to which the voltage of 4 V is applied is applied to the well NW, which surrounds the memory wells MPW0 and MPW1 and the switching mechanism formation well PW0 and in which the P-type MOS transistors 37 of the switching mechanisms 36a, 36b, 36c, and 36d are disposed. Simultaneously, the N-type MOS transistors 38 of the switching mechanisms 36a and 36c are turned on so that the voltage of −3 V applied to the second memory gate line HS0b and then the sub control lines W11 and W21 is also applied to one of the diffusion layers of each of the P-type MOS transistors 37 connected with the sub control lines W11 and W21. As a result, a voltage difference of 7 V occurs between the diffusion layer of the P-type MOS transistor 37 and the well NW in which the P-type MOS transistor 37 is disposed, and thus the transistor is required to have a junction breakdown voltage equal to or larger than the voltage difference. Methods for solving such a problem will be described later in "(4) Non-volatile semiconductor memory device according to third embodiment".

(3-4) Operations and Effects

In the non-volatile semiconductor memory device 31 having the above-described configuration, a charge storage memory gate voltage for achieving charge injection into the charge storage layer is applied to the second control line HS0 disposed in the programming memory cell M11 at the data programming operation. Simultaneously, among the switching mechanisms 36a and 36b provided on the first control line DL0 in the non-volatile semiconductor memory device 31, only the switching mechanism 36a provided for the programming memory cell M11 is turned on by a switching gate voltage from the first control line DL0 to apply the charge storage memory gate voltage only to the sub control line W11 connected with the switching mechanism 36a.

Simultaneously, among the switching mechanisms 36a and 36b provided along the first control line DL0 in the non-volatile semiconductor memory device 31, the switching mechanism 36b provided only for the non-programming memory cells M21 and M22 is turned off by the switching gate voltage from the first control line DL0 and the memory gate voltage from the second control line HS1 to prevent voltage application to the sub control line W12 connected with the switching mechanism 36b.

Accordingly, when the data programming operation is repeated on the memory unit 2a in the non-volatile semiconductor memory device 31, the switching mechanism 36b prevents application of the charge storage memory gate voltage applied to the second control line HS0 to the sub control line W12. Thus, without consideration on the charge storage memory gate voltage, voltage values at the non-programming memory cells M21 and M22 provided on the sub control line W12 can be adjusted such that disturbance is unlikely to occur. Accordingly, the occurrence of disturbance at the non-programming memory cells M21 and M22 can be reduced.

In this manner, in the non-volatile semiconductor memory device 31 according to the present invention, the memory cells M11, M12, M21, and M22 can be arranged in one direction along the first control line DL0. In addition, the occurrence of disturbance can be reduced at each of the memory units 2a and 2b. Accordingly, the occurrence rate of disturbance can be reduced as compared to conventional cases.

In the non-volatile semiconductor memory device 31 according to the present invention, too, for example, the sub control line W11 is provided as a connection wire connecting the memory transistors F11 and F12 and the first control line DL0. In addition, the sub control line W11 is directly disposed facing to the charge storage layers of the memory transistors F11 and F12 and provided as the gates of the memory transistors F11 and F12.

Accordingly, in the non-volatile semiconductor memory device 31, too, for example, the sub control line W11 as a connection wire connecting the memory transistors F11 and F12 and the switching mechanism 36a, and the gates of the memory transistors F11 and F12 can be disposed in a single wiring layer. This configuration allows a simplified circuit configuration as compared to a case in which the gates of the memory transistors F11 and F12 and the sub control line W11 are disposed in separate wiring layers, thereby achieving downsizing accordingly.

At the data reading operation in the non-volatile semiconductor memory device 31, too, the bit lines CL0 and CL1 to which the precharge voltage is applied are directly connected with the switch transistors ST11, ST12, ST21, and ST22 of the memory cells M11, M12, M21, and M22 arranged along the first control lines DL0 and DL1, which avoids a hierarchized structure. In addition, the non-volatile semiconductor memory device 31 does not need to have address selectivity of selecting a memory cell column corresponding to each of the switching mechanisms 36a, 36b, 36c, and 36d at the data reading operation. Instead, the switching mechanisms 36a, 36b, 36c, and 36d are all turned on and off under identical operational conditions (in this case, each P-type MOS transistor 37 are turned off, and the N-type MOS transistor 38 in a pair with the P-type MOS transistor 37 is turned on). Accordingly, the switching mechanisms 36a, 36b, 36c, and 36d have identical states of electrical connection with the corresponding sub control lines W11, W12, W21, and W22.

At the data reading operation in the non-volatile semiconductor memory device 31, the voltage of 0 V is supplied from the switching mechanisms 36a, 36b, 36c, and 36d to the corresponding sub control lines W11, W12, W21, and W22. Thus, effectively no charging and discharging are performed at the memory transistor F11 and the like, and a data reading time is not affected by switching operation of the switching mechanisms 36a, 36b, 36c, and 36d. In this manner, the switching mechanisms 36a, 36b, 36c, and 36d each have such a characteristic that the occurrence rate of disturbance can be reduced at the data programming operation due to hierarchization of the corresponding memory cell columns. In addition, the switching mechanisms 36a, 36b, 36c, and 36d each have a data reading characteristic equivalent to that of a configuration not including the switching mechanisms 36a, 36b, 36c, and 36d because this hierarchized structure does not affect the data reading operation at all.

In addition, since the switching mechanisms 36a, 36b, 36c, and 36d do not selectively turn on and off the memory cell columns at the data reading operation, the turning on and off operation is not needed when the address of a memory cell column to be read is switched at each data reading cycle. Accordingly, charging and discharging are not performed at the memory transistor F11 or the like at each data reading cycle, and thus the reading speed is not affected by the element performance of the switching mechanisms 36a, 36b, 36c, and 36d. As a result, fast operation is not required at the switching mechanisms 36a, 36b, 36c, and 36d, which leads to reduction in the sizes of the switching mechanisms 36a, 36b, 36c, and 36d and the sizes of control circuits thereof.

In the non-volatile semiconductor memory device 25 according to the first embodiment described above (FIG. 3), at the data programming operation, output voltages of the switching transistors 26a, 26b, 26c, and 26d decrease by the threshold voltage Vth. Thus, a switching gate voltage (4+Vth V) increased from the charge storage memory gate voltage by the amount of this decrease in advance needs to be applied to the gates of the switching transistors 26a, 26b, 26c, and 26d.

In the non-volatile semiconductor memory device 31 according to the second embodiment, however, the output voltages of the switching mechanisms 36a, 36b, 36c, and 36d do not decrease at the data programming operation. Thus, the switching gate voltage applied to the switching mechanisms 36a, 36b, 36c, and 36d can be reduced as compared to the non-volatile semiconductor memory device 25 according to the first embodiment. Accordingly, a voltage applied to a MOS transistor of a peripheral circuit (not illustrated) can be reduced.

In the non-volatile semiconductor memory device 31, which includes the switching mechanism 36a having a CMOS structure including, for example, the N-type MOS transistor 38 and the P-type MOS transistor 37, the P-type MOS transistor 37 of the switching mechanism 36a is disposed in the well NW provided to separate the memory well MPW0 and the switching mechanism formation well PW0 from each other. This configuration eliminates the need to separately provide an N-type well for the P-type MOS transistor 37 at a place different from where the well NW is provided, thereby achieving a circuit configuration downsized accordingly.

In addition, in the non-volatile semiconductor memory device 31, the switching mechanisms 36a and 36b having CMOS structures are controlled through the first control line DL0, and a memory gate voltage is applied from the second control lines HS0 and HS1, which are wired in parallel to the word lines ROW00, ROW01, ROW10, and ROW11, to the memory cells M11, M12, M21, and M22 through the switching mechanisms 36a and 36b. Thus, at the data programming operation, the data reading operation, and the data erasing operation, only positive voltages are applied to the first control line DL0, and no negative voltages need to be applied.

With this configuration, in the non-volatile semiconductor memory device 31, for example, when a larger number of the memory cells M11, M12, M31, M32, . . . are disposed in the memory well MPW0, and the number of the first control lines DL0, DL1, . . . is increased accordingly, only positive voltages are applied to the first control lines DL0, DL1, . . . . Thus, since no negative voltages are needed to be applied, a power circuit configured to apply voltage to the first control lines DL0, DL1, . . . can be simplified accordingly, and hence the formation area of the power circuit can be reduced.

According to the above-described configuration, while voltage from the second control line HS0 is applied, as a memory gate voltage, to the sub control line W11 through the switching mechanism 36a, the switching mechanism 36b can block voltage application to the corresponding sub control line W12. Thus, while the memory cells M11, M12, M21, and M22 are arranged in one direction along the first control line DL0, the number of memory cells to which the memory gate voltage is applied can be reduced by the switching mechanism 36b, which leads to reduction in the occurrence of disturbance accordingly. The sub control line W11 to which a memory gate voltage is applied from the second control line HS0 are used as the gates of the memory transistors F11 and F12, and thus the sub control line W11 and the gates are disposed in a single wiring layer, thereby achieving downsizing as compared to a case in which the sub control line W11 and the gates are disposed in separate wiring layers.

(4) Non-Volatile Semiconductor Memory Device According to Third Embodiment

Figure 12:
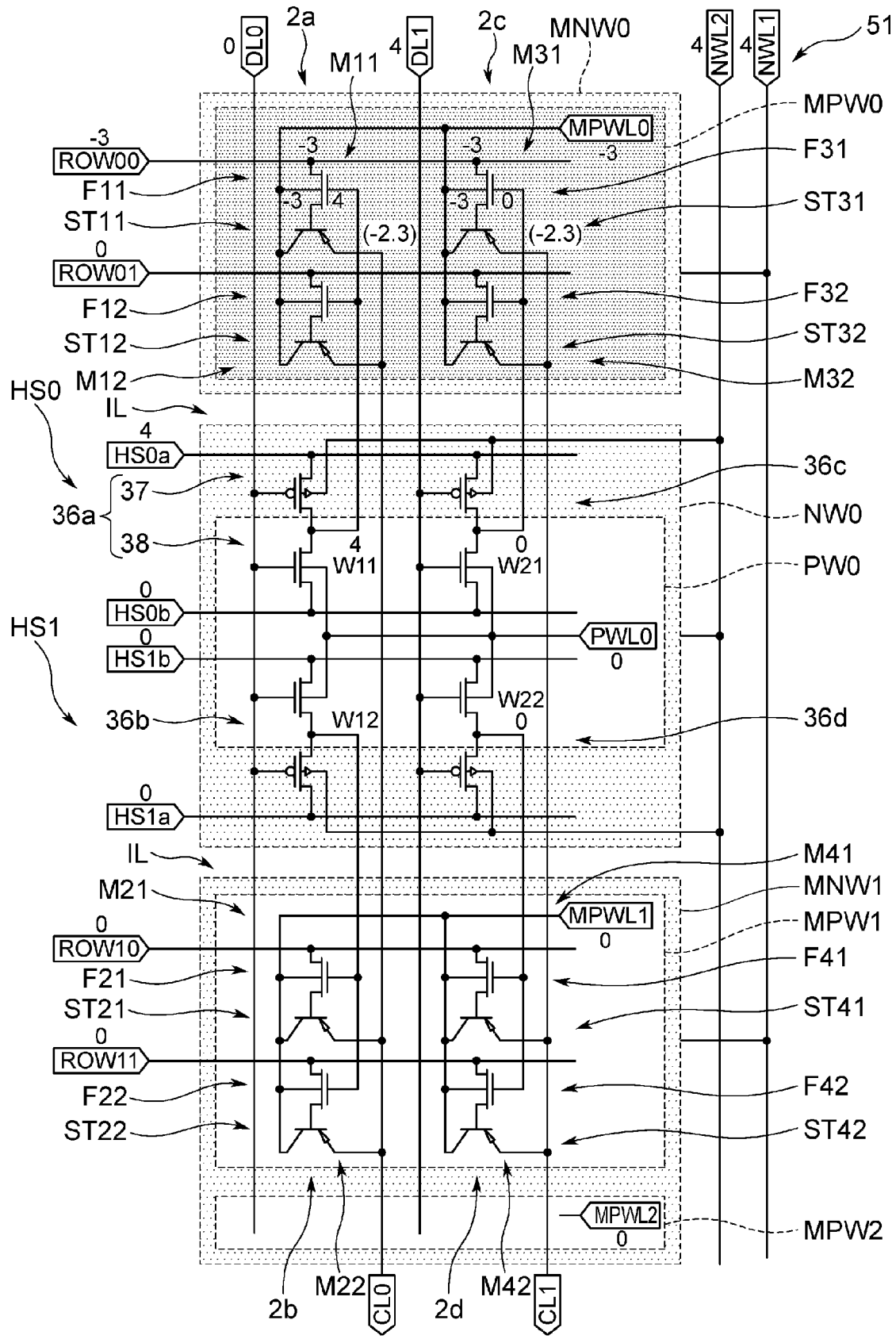
FIG. 12 is a schematic view illustrating voltage at each site in a circuit configuration of a non-volatile semiconductor memory device according to a third embodiment at data programming operation.
Figure 13:
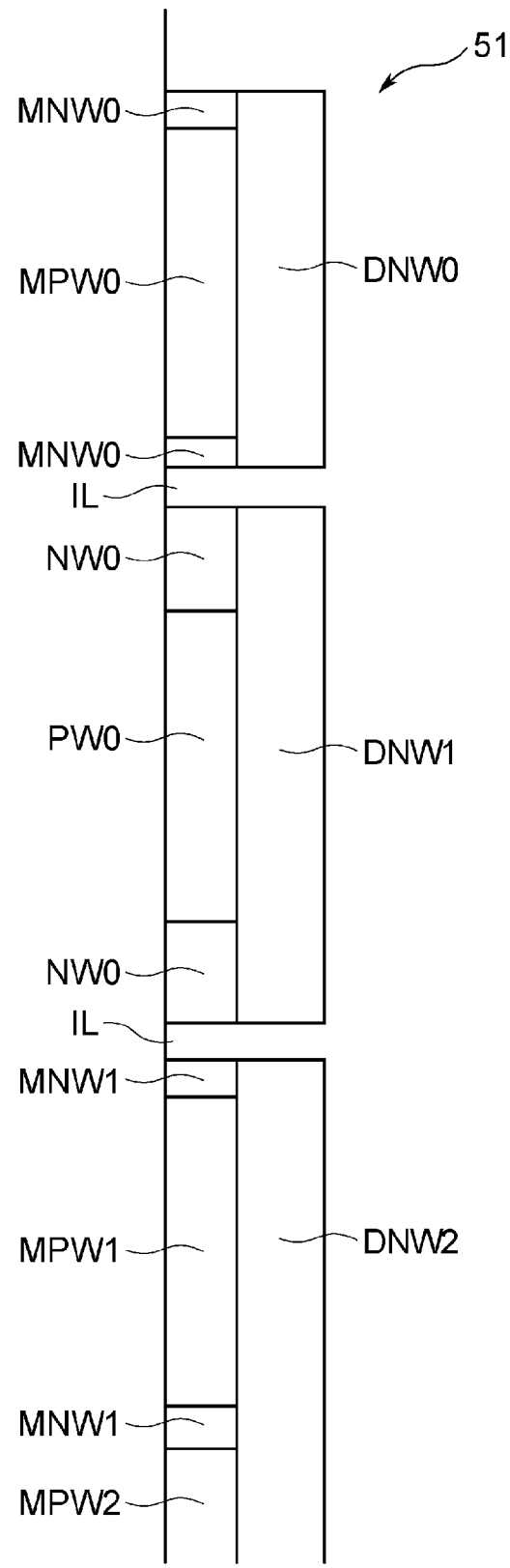
FIG. 13 is a schematic view illustrating the configurations of a deep well, a memory well, a switching mechanism formation well, and a well in the non-volatile semiconductor memory device according to the third embodiment.

In FIG. 12, in which any corresponding part to that in FIG. 8 is denoted by an identical reference sign, 51 denotes a non-volatile semiconductor memory device according to the third embodiment. Similarly to the second embodiment described above, a switching gate voltage is applied to the first control lines DL0 and DL1, and a memory gate voltage is applied to the second control lines HS0 and HS1. In this case, as illustrated in FIGS. 12 and 13, for example, an element isolation layer IL is disposed between an N-type well MNW0 and an N-type deep well DNW0 (FIG. 13) surrounding the memory well MPW0, and an N-type well NW0 and an N-type deep well DNW1 surrounding the switching mechanism formation well PW0 in the non-volatile semiconductor memory device 51. Thus, the well MNW0 and the deep well DNW0 are separated from the well NW0 and the deep well DNW1, which is a configuration different from that of the non-volatile semiconductor memory device 31 (FIG. 8) according to the second embodiment described above.

As illustrated in FIG. 12, in the non-volatile semiconductor memory device 51, the well wire NWL1 is provided to the well MNW0 surrounding the memory well MPW0 and to a well MNW1 surrounding the memory well MPW1. The well wire NWL1 allows uniform voltage application to the wells MNW0 and MNW1. In the non-volatile semiconductor memory device 51, another well wire NWL2 provided separately from the well wire NWL1 is connected with the well NW0 surrounding the switching mechanism formation well PW0 to apply, to the well NW0 surrounding the switching mechanism formation well PW0, a voltage different from the voltage applied to the wells MNW0 and MNW1 surrounding the memory wells MPW0 and MPW1.

Accordingly, in the non-volatile semiconductor memory device 51, the value of voltage applied to the well MNW0 and the deep well DNW0 surrounding the memory well MPW0 and the value of voltage applied to the well NW0 and the deep well DNW1 surrounding the switching mechanism formation well PW0 can be individually changed. Thus, voltages applied at the data programming operation, the data reading operation, and the data erasing operation can be adjusted to optimum voltage values without mutual restriction.

Although described in detail later in "(4-3) Data erasing operation", voltage values of the well NW0 and the deep well DNW1 surrounding the switching mechanism formation well PW0 can be reduced without restriction placed by voltages applied to the well MNW0 and the deep well DNW0 in which the erasing memory cells M11, M12, M31, and M32 are disposed, especially at the data erasing operation in the non-volatile semiconductor memory device 51. Accordingly, voltage loads on the switching mechanisms 36a, 36b, 36c, and 36d can be reduced, which is not provided by the non-volatile semiconductor memory device 31 according to the second embodiment.

In this configuration, the P-type MOS transistors 37 of the switching mechanisms 36a, 36b, 36c, and 36d having CMOS structures are disposed in the well NW0 surrounding the switching mechanism formation well PW0. A voltage same as that applied to the well NW0 surrounding the switching mechanism formation well PW0 is applied to the P-type MOS transistors 37 through the well wire NWL2. The rest of the configuration of the non-volatile semiconductor memory device 51 is same as that of the non-volatile semiconductor memory device 31 according to the second embodiment described above, and thus any duplicate description thereof will be omitted. The following sequentially describes data programming operation, data reading operation, and data erasing operation of the non-volatile semiconductor memory device 51.

(4-1) Data Programming Operation

FIG. 12 indicates voltage at each site when data is programmed into the memory cell M11 in the memory unit 2a on the first row and the first column but no data is programmed into the memory cell M12 in the memory unit 2a nor the memory cells M21, M22, M31, M32, and M41, and M42 in the other memory units 2b, 2c, and 2d. In this case, voltages same as those applied in the non-volatile semiconductor memory device 31 according to the second embodiment illustrated in FIG. 8 described above are applied in the non-volatile semiconductor memory device 51. Thus, duplicate detailed description thereof will be schematically provided below.

A charge storage memory gate voltage of 4 V is applied to the first memory gate line HS0a of the second control line HS0 on which the programming memory cell M11 is disposed, and a charge storage prevention memory gate voltage of 0 V is applied to the second memory gate line HS0b of the second control line HS0. Simultaneously, a voltage of 4 V is applied from the well wire NWL2 to the well NW0 in which the P-type MOS transistors 37 of the switching mechanisms 36a, 36b, 36c, and 36d are provided, and a voltage of 0 V is applied from the switching mechanism formation well wire PWL0 to the switching mechanism formation well PW0 in which the N-type MOS transistors 38 of the switching mechanisms 36a, 36b, 36c, and 36d are provided.

An on voltage of 0 V is applied, as a switching gate voltage, to the gates of the P-type MOS transistor 37 and the N-type MOS transistor 38 of the switching mechanism 36a provided for the programming memory cell M11 through the first control line DL0. Accordingly, in the switching mechanism 36a, the P-type MOS transistor 37 is turned on by the voltage difference between the first memory gate line HS0a and the first control line DL0, and the N-type MOS transistor 38 is turned off by the voltage difference between the second memory gate line HS0b and the first control line DL0.

As a result, the switching mechanism 36a applies the charge storage memory gate voltage of 4 V applied to the first memory gate line HS0a to the sub control line W11 through the P-type MOS transistor 37. Simultaneously, the N-type MOS transistor 38 of the switching mechanism 36a, which is being turned off, blocks voltage application from the second memory gate line HS0b to the sub control line W11. In this manner, in the non-volatile semiconductor memory device 51, too, the charge storage memory gate voltage is applied from the first memory gate line HS0a to the sub control line W11 through the switching mechanism 36a, and then to the gate of the memory transistor F11 of the programming memory cell M11.

Similarly to the non-volatile semiconductor memory device 31 according to the second embodiment described above, at the data programming operation in the non-volatile semiconductor memory device 51, the switching gate voltage applied from the first control line DL0 to the switching mechanism 36a does not need to be set to a voltage equal to or larger than the charge storage memory gate voltage applied to the second control line HS0. Thus, the voltage value of the switching gate voltage applied to the switching mechanism 36a can be reduced by the threshold voltage Vth as compared to the non-volatile semiconductor memory device 25 according to the first embodiment.

Similarly to the non-volatile semiconductor memory device 31 according to the second embodiment, in the memory transistor F11 of the programming memory cell M11, charge is injected into the charge storage layer through the source due to the tunneling effect caused by a voltage difference (7 V) between a voltage (−3 V) applied to the memory well MPW0 and the source and a charge storage memory gate voltage (4 V) applied to the gate, thereby achieving a data programmed state.

Simultaneously, in the non-programming memory cell M12 in the memory unit 2a including the programming memory cell M11, the charge storage memory gate voltage of 4 V is applied from the first memory gate line HS0a to the gate of the memory transistor F12 through the switching mechanism 36a and the sub control line W11, while the source of the memory transistor F12 connected with the word line ROW01 is at 0 V. Thus, the voltage difference between the gate and source is small enough to reduce charge injection into the charge storage layer, thereby maintaining a no-data programmed state.

Simultaneously, in the memory unit 2b sharing the first control line DL0 with the memory unit 2a including the programming memory cell M11, the switching gate voltage of 0 V is applied, as a PMOS on voltage, to the switching mechanism 36b from the first control line DL0 shared with the memory unit 2a including the programming memory cell M11. Simultaneously, a charge storage prevention memory gate voltage of 0 V is applied to the first memory gate line HS1a and the second memory gate line HS1b of the second control line HS1 disposed only on the non-programming memory cells M21, M22, M41, and M42 into which data is not programmed.

Accordingly, the on voltage of 0 V is applied, through the first control line DL0, to the gate of the P-type MOS transistor 37 of the switching mechanism 36b connected with the second control line HS1, and a voltage of 0 V is applied to the other end of the P-type MOS transistor 37 through the first memory gate line HS1a. As a result, the P-type MOS transistor 37 is turned off. Simultaneously, the switching gate voltage of 0 V is applied, as an off voltage, from the first control line DL0 to the gate of the N-type MOS transistor 38 of the switching mechanism 36b, and the voltage of 0 V is applied to the other end of the N-type MOS transistor 38 from the second memory gate line HS1b. As a result, the N-type MOS transistor 38 is turned off. Accordingly, voltage application to the sub control line W12 connected with the switching mechanism 36b from the switching mechanism 36b is blocked.

In addition, a voltage of 0 V is applied to the sources of the memory transistors F21 and F22 of the non-programming memory cells M21 and M22 through the word lines ROW10 and ROW11, and a voltage of 0 V is applied, through the memory well wire MPWL1, to the memory well MPW1 in which only the non-programming memory cells M21, M22, M41, and M42 are disposed. Accordingly, in each of the memory transistors F21 and F22 of the non-programming memory cells M21 and M22, no voltage difference occurs between the gate and the memory well MPW1 nor between the gate and source, so that no charge is injected into the charge storage layers of the memory transistors F21 and F22, and thus a no-data programmed state is maintained. In this case, too, similarly to the above-described case, in each of the switch transistors ST21 and ST22, the bit line CL0 connected with the emitter is at −2.3 V through the above-described operation, whereas the base voltage only takes a negative value obtained by subtracting the threshold voltages of the memory transistors F21 and F22 from the voltage of 0 V applied to the word lines ROW10 and ROW11. Accordingly, the switch transistors ST21 and ST22 are each turned off with no current flowing between the emitter and base.

As described above, in the memory unit 2a including the programming memory cell M11, the charge storage memory gate voltage applied to the second control line HS0 (first memory gate line HS0a) is applied, through the switching mechanism 36a, to the memory transistor F12 of the non-programming memory cell M12 into which data is not programmed, which causes a slight voltage difference in the memory transistor F12 of the non-programming memory cell M12. Thus, in the non-programming memory cell M12 in the memory unit 2a including the programming memory cell M11, when the charge storage memory gate voltage is repeatedly applied on the sub control line W11 due to repetition of the data programming operation on the programming memory cell M11 sharing the sub control line W11, disturbance is likely to occur.

However, in the memory unit 2b only including the non-programming memory cells M21 and M22, the non-programming memory cells M21 and M22 are arranged in one direction along the first control line DL0 on which the programming memory cell M11 is disposed, but the switching mechanism 36b prevents application of the charge storage memory gate voltage applied to the programming memory cell M11 to the non-programming memory cells M21 and M22, which significantly reduces voltage differences at the memory transistors F21 and F22 and thus prevents disturbance.

In this manner, in the non-volatile semiconductor memory device 51 according to the present invention, too, the occurrence of disturbance can be reduced at the memory cells M21 and M22 in the memory unit 2b sharing the first control line DL0 with the memory unit 2a, although it is difficult to reduce the occurrence of disturbance at the non-programming memory cell M12 in the memory unit 2a including the programming memory cell M11. Thus, the occurrence of disturbance can be reduced as compared to conventional cases when the memory cells M11, M12, M21, and M22 are arranged in the column direction like conventional cases.

The same argument as that in "(3-1) Data programming operation" described above applies to the memory unit 2c on the first row and the second column, which shares the second control line HS0 with the memory unit 2a including the programming memory cell M11 and only includes the non-programming memory cells M31 and M32 are disposed, and the memory unit 2d on the second row and the second column, which only includes the non-programming memory cells M41 and M42 are disposed. Thus, any duplicate description thereof will be omitted.

(4-2) Data Reading Operation

Figure 14:
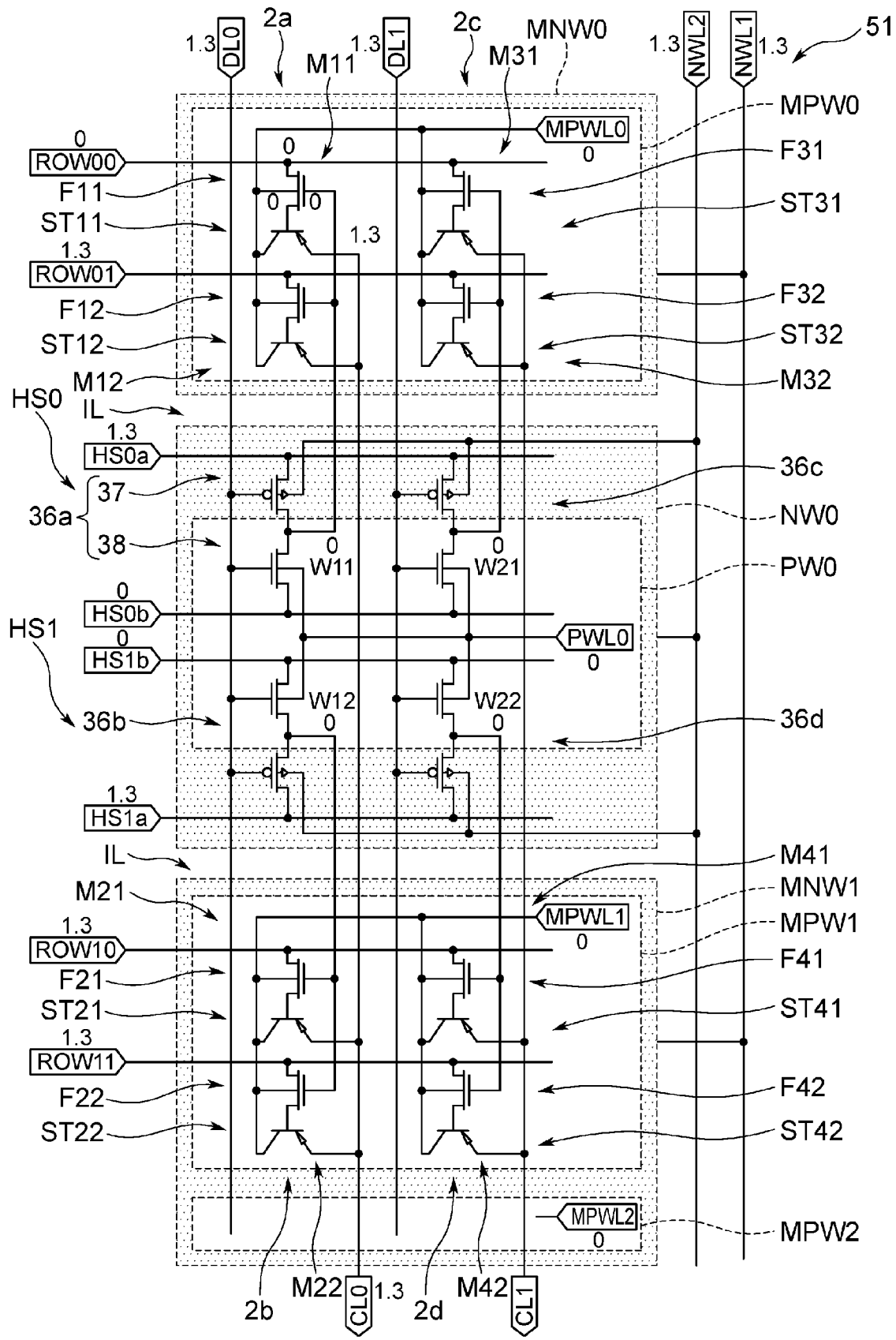
FIG. 14 is a schematic view illustrating voltage at each site in the circuit configuration of the non-volatile semiconductor memory device according to the third embodiment at data reading operation.

FIG. 14, in which any corresponding part to that in FIG. 12 is denoted by an identical reference sign, indicates voltage at each site when, in the non-volatile semiconductor memory device 51, data is read from the memory cell M11 in the memory unit 2a on the first row and the first column but no data is read from the memory cell M12 in the memory unit 2a nor the memory cells M21, M22, M31, M32, M41, and M42 in the other memory units 2b, 2c, and 2d.

In this case, a voltage of 1.3 V, which is equal to the precharge voltage, is applied, through the well wire NWL1, to the well MNW0 surrounding the memory well MPW0 in which the reading memory cell M11 is disposed, and to the well MNW1 surrounding the memory well MPW1 in which only the non-reading memory cells M21, M22, M41, and M42 are disposed. In addition, a voltage of 1.3 V, which is equal to the precharge voltage, is applied, through the well wire NWL2, to the well NW0 in which the P-type MOS transistors 37 of the switching mechanisms 36a, 36b, 36c, and 36d are provided.

Voltages same as those described above in "(3-2) Data reading operation" are applied to sites of the non-volatile semiconductor memory device 51 thus configured. It is possible to determine whether data is programmed into the memory transistor F11 of the reading memory cell M11 by sensing any change in the precharge voltage at the bit line CL0 connected with the reading memory cell M11.

(4-3) Data Erasing Operation

Figure 15:
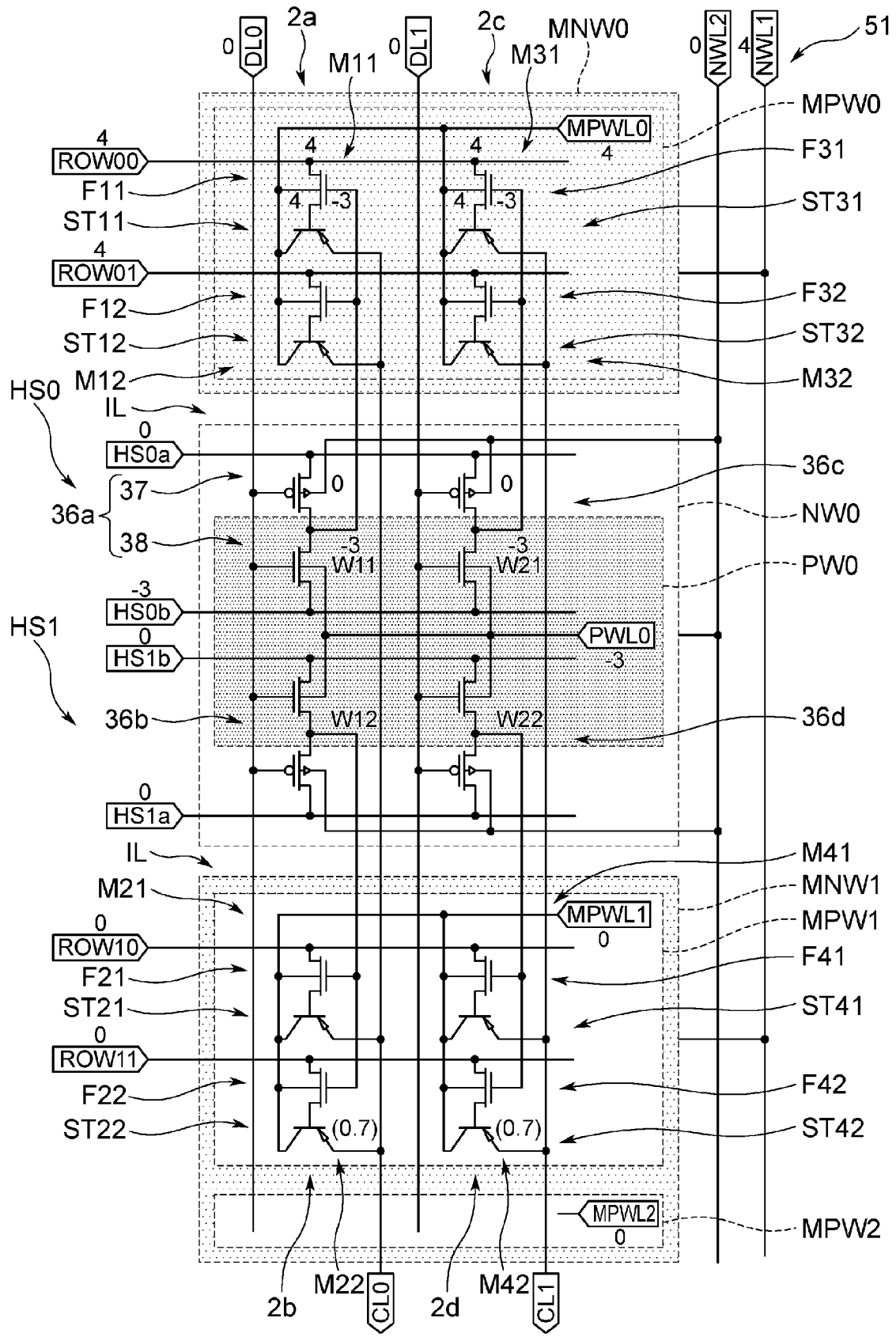
FIG. 15 is a schematic view illustrating voltage at each site in the circuit configuration of the non-volatile semiconductor memory device according to the third embodiment at data erasing operation.

FIG. 15, in which any corresponding part to that in FIG. 12 is denoted by an identical reference sign, indicates voltage at each site when data is collectively erased from all memory cells M11, M12, M31, and M32 disposed in the memory well MPW0 but data is maintained intact in the memory cells M21, M22, M41, and M42 disposed in the memory well MPW1.

In this case, for the memory units 2a and 2c including the memory cells (erasing memory cells) M11, M12, M31, and M32 from which data is erased, an non-erasing voltage of 0 V is applied from the first memory gate line HS0a of the second control line HS0 to the P-type MOS transistors 37 of the switching mechanisms 36a and 36c, and an erasing voltage of −3 V is applied from the second memory gate line HS0b of the second control line HS0 to the N-type MOS transistors 38 of the switching mechanisms 36a and 36c. A voltage of 0 V is applied to the first control lines DL0 and DL1 as a switching gate voltage, and a voltage of −3 V, which is equal to the erasing voltage, is applied to the switching mechanism formation well PW0 through the well wire PWL0.

Accordingly, in the switching mechanisms 36a and 36c to which the erasing voltage is applied through the second control line HS0, the P-type MOS transistors 37 are turned off by voltage differences between the first memory gate line HS0a and the first control lines DL0 and DL1, respectively, and block voltage application from the first memory gate line HS0a to the sub control lines W11 and W21. The N-type MOS transistors 38 of the switching mechanisms 36a and 36c are turned on by voltage differences between the second memory gate line HS0b and the first control lines DL0 and DL1, respectively, and apply the erasing voltage of −3 V applied to the second memory gate line HS0b to the corresponding sub control lines W11 and W21.

Simultaneously, a voltage of 4 V is applied to the word lines ROW00 and ROW01 disposed in the erasing memory cells M11, M12, M31, and M32, and a voltage of 4 V is applied, through the memory well wire MPWL0, to the memory well MPW0 in which the erasing memory cells M11, M12, M31, and M32 are disposed. Accordingly, in the memory transistors F11, F12, F31, and F32 disposed in the erasing memory cells M11, M12, M31, and M32, the erasing voltage of −3 V applied to the second memory gate line HS0b is applied to the sub control lines W11 and W21 serving as gates through the switching mechanisms 36a and 36c. In addition, the voltage of 4 V is applied to the sources and the memory well MPW0 thereof. This configuration achieves a voltage difference large enough to cause the tunneling effect for removing charge from each charge storage layer, thereby achieving a data erased state.

In the non-volatile semiconductor memory device 31 according to the second embodiment illustrated in FIG. 11, the memory wells MPW0 and MPW1 and the switching mechanism formation well PW0 are surrounded by the same well NW. Thus, when a voltage of 4 V is applied to the well NW in accordance with the memory well MPW0 in which the erasing memory cells M11, M12, M31, and M32 are disposed, a large voltage difference of 7 V approximately occurs between the well NW and each P-type MOS transistor 37 to one of the diffusion layers of which a voltage of −3 V is applied from the sub control line. Thus, the P-type MOS transistor 37 having a breakdown voltage high enough to withstand the voltage difference of 7 V needs to be employed in each of the switching mechanisms 36a, 36b, 36c, and 36d of the non-volatile semiconductor memory device 31 according to the second embodiment.

In the non-volatile semiconductor memory device 51 according to the third embodiment illustrated in FIG. 15, however, a voltage of 4 V is applied to the well MNW0 and the well MNW1 surrounding the memory well MPW0 in accordance with the voltage of 4 V applied to the memory well MPW0 in which the erasing memory cells M11, M12, M31, and M32 are disposed, whereas the element isolation layer IL electrically insulates the wells MNW0 and MNW1 surrounding the memory wells MPW0 and MPW1 from the well NW0 surrounding the switching mechanism formation well PW0. Thus, a voltage of 0 V can be applied to the well NW0 surrounding the switching mechanism formation well PW0 without restriction placed by the voltages applied to the wells MNW0 and MNW1 surrounding the memory wells MPW0 and MPW1.

Accordingly, in the non-volatile semiconductor memory device 51 according to the third embodiment, merely a voltage difference of 3 V approximately occurs between the switching mechanism formation well PW0 to which a voltage of −3 V is applied and the well NW0 at 0 V surrounding the switching mechanism formation well PW0. Thus, voltages applied to the P-type MOS transistors 37 of the switching mechanisms 36a, 36b, 36c, and 36d can be reduced as compared to the non-volatile semiconductor memory device 31 according to the second embodiment described above, which eliminates the need to employ the P-type MOS transistor 37 having a high breakdown voltage.

As described above, in the non-volatile semiconductor memory device 51, voltages applied to the switching mechanisms 36a, 36b, 36c, and 36d can be reduced to a voltage difference of 3 V at the data erasing operation as well as the data programming operation and the data reading operation. Thus, for example, an insulating film having a thickness equal to or smaller than 5 nm, which exhibits a low breakdown voltage, can be disposed on a channel region in each of the P-type MOS transistors 37 and the N-type MOS transistor 38 of the switching mechanisms 36a, 36b, 36c, and 36d.

The voltage of 0 V is applied to the gates of the P-type MOS transistors 37 and the N-type MOS transistors 38 of the switching mechanisms 36b and 36d provided for the non-erasing memory cells M21, M22, M41, and M42 through the first control lines DL0 and DL1 shared with the switching mechanisms 36a and 36c on the other row. In addition, the voltage of 0 V is applied from the first memory gate line HS1a and the second memory gate line HS1b of the second control line HS1 to the P-type MOS transistors 37 and the N-type MOS transistors 38.

Accordingly, in each of the switching mechanisms 36b and 36d, the P-type MOS transistor 37 is turned off by voltage differences between the first memory gate line HS1a and the first control lines DL0 and DL1, respectively, and the N-type MOS transistor 38 is turned off by voltage differences between the second memory gate line HS1b and the first control lines DL0 and DL1, respectively. As a result, voltage application from the second control line HS1 to the corresponding sub control lines W12 and W22 is blocked.

In the non-erasing memory cells M21, M22, M41, and M42, a voltage of 0 V is applied to the sources of the memory transistors F21, F22, F41, and F42 through the word lines ROW10 and ROW11, and a voltage of 0 V is applied to the memory well MPW1 through the memory well wire MPWL1. Accordingly, in each of the memory transistors F21, F22, F41, and F42 of the non-erasing memory cells M21, M22, M41, and M42, no voltage difference occurs between the gate and source nor between the gate and the memory well MPW1, which maintains the state of charge storage in the charge storage layer and thus maintains the state of data intact without erasing.

In the non-erasing memory cells M21, M22, M41, and M42, the switching mechanisms 36b and 36d are turned off to block voltage application from the second control line HS1 to the corresponding sub control lines W12 and W22, and thus no voltage is applied from the sub control lines W12 and W22 to the gates of the memory transistors F21, F22, F41, and F42. Accordingly, in the non-erasing memory cells M21, M22, M41, and M42, the occurrence of disturbance can be reduced at the memory transistors F21, F22, F41, and F42 by applying equivalent voltages to the word lines ROW10 and ROW11 and the memory well MPW1.

(4-4) Operations and Effects

In the non-volatile semiconductor memory device 51 having the above-described configuration, too, a charge storage memory gate voltage for achieving charge injection into the charge storage layer is applied to the second control line HS0 disposed in the programming memory cell M11 at the data programming operation. Simultaneously, among the switching mechanisms 36a and 36b provided on the first control line DL0 in the non-CLEAN volatile semiconductor memory device 51, only the switching mechanism 36a provided for the programming memory cell M11 is turned on by a switching gate voltage from the first control line DL0 to apply the charge storage memory gate voltage only to the sub control line W11 connected with the switching mechanism 36a.

Simultaneously, in the non-volatile semiconductor memory device 51, too, among the switching mechanisms 36a and 36b provided along the first control line DL0, the switching mechanism 36b provided only for the non-programming memory cells M21 and M22 is turned off by the switching gate voltage from the first control line DL0 and the memory gate voltage from the second control line HS1 to prevent voltage application to the sub control line W12 connected with the switching mechanism 36b.

Accordingly, in the non-volatile semiconductor memory device 51, too, the switching mechanism 36b prevents application of the charge storage memory gate voltage applied to the second control line HS0 to the sub control line W12 when the data programming operation is repeated on the memory unit 2a. Thus, without consideration on the charge storage memory gate voltage, voltage values at the non-programming memory cells M21 and M22 provided on the sub control line W12 can be adjusted such that disturbance is unlikely to occur. Accordingly, the occurrence of disturbance at the non-programming memory cells M21 and M22 can be reduced.

In this manner, in the non-volatile semiconductor memory device 51 according to the present invention, the memory cells M11, M12, M21, and M22 can be arranged in one direction along the first control line DL0. In addition, the occurrence of disturbance can be reduced at each of the memory units 2a and 2b. Accordingly, the occurrence rate of disturbance can be reduced as compared to conventional cases.

In the non-volatile semiconductor memory device 51 according to the present invention, too, for example, the sub control line W11 is provided as a connection wire connecting the memory transistors F11 and F12 and the first control line DL0. In addition, the sub control line W11 is directly disposed facing to the charge storage layers of the memory transistors F11 and F12 and provided as the gates of the memory transistors F11 and F12.

Accordingly, in the non-volatile semiconductor memory device 51, too, for example, the sub control line W11 as a connection wire connecting the memory transistors F11 and F12 and the switching mechanism 36a, and the gates of the memory transistors F11 and F12 can be disposed in a single wiring layer. This configuration allows a simplified circuit configuration as compared to a case in which the gates of the memory transistors F11 and F12 and the sub control line W11 are disposed in separate wiring layers, thereby achieving downsizing accordingly.

At the data reading operation in the non-volatile semiconductor memory device 51, too, the bit lines CL0 and CL1 to which the precharge voltage is applied are directly connected with the switch transistors ST11, ST12, ST21, and ST22 of the memory cells M11, M12, M21, and M22 arranged along the first control lines DL0 and DL1, which avoids a hierarchized structure. In addition, the non-volatile semiconductor memory device 31 does not need to have address selectivity of selecting a memory cell column corresponding to each of the switching mechanisms 36a, 36b, 36c, and 36d at the data reading operation. Instead, the switching mechanisms 36a, 36b, 36c, and 36d are all turned on and off under identical operational conditions (in this case, each P-type MOS transistor 37 are turned off, and the N-type MOS transistor 38 in a pair with the P-type MOS transistor 37 is turned on). Accordingly, the switching mechanisms 36a, 36b, 36c, and 36d have identical states of electrical connection with the corresponding sub control lines W11, W12, W21, and W22.

In the non-volatile semiconductor memory device 31, the voltage of 0 V is supplied from the switching mechanisms 36a, 36b, 36c, and 36d to the corresponding sub control lines W11, W12, W21, and W22 at the data reading operation. Thus, effectively no charging and discharging are performed at the memory transistor F11 and the like, and a data reading time is not affected by switching operation of the switching mechanisms 36a, 36b, 36c, and 36d. In this manner, the switching mechanisms 36a, 36b, 36c, and 36d each have such a characteristic that the occurrence rate of disturbance can be reduced at the data programming operation due to hierarchization of the corresponding memory cell columns.

In addition, the switching mechanisms 36a, 36b, 36c, and 36d each have a data reading characteristic equivalent to that of a configuration not including the switching mechanisms 36a, 36b, 36c, and 36d because this hierarchized structure does not affect the data reading operation at all.

In addition, since the switching mechanisms 36a, 36b, 36c, and 36d do not selectively turn on and off the memory cell columns at the data reading operation, the turning on and off operation is not needed when the address of a memory cell column to be read is switched at each data reading cycle. Accordingly, charging and discharging are not performed at the memory transistor F11 or the like at each data reading cycle, and thus the reading speed is not affected by the element performance of the switching mechanisms 36a, 36b, 36c, and 36d. As a result, fast operation is not required at the switching mechanisms 36a, 36b, 36c, and 36d, which leads to reduction in the sizes of the switching mechanisms 36a, 36b, 36c, and 36d and the sizes of control circuits thereof.

In addition, in the non-volatile semiconductor memory device 51, similarly to the non-volatile semiconductor memory device 31 according to the second embodiment described above, the output voltages of the switching mechanisms 36a, 36b, 36c, and 36d do not decrease at the data programming operation. Thus, the switching gate voltage applied to the switching mechanisms 36a, 36b, 36c, and 36d can be reduced as compared to the non-volatile semiconductor memory device 25 according to the first embodiment. Accordingly, a voltage applied to a MOS transistor of a peripheral circuit (not illustrated) can be reduced.

In addition, in the non-volatile semiconductor memory device 51, too, the switching mechanisms 36a and 36b having CMOS structures are controlled through the first control line DL0, and a memory gate voltage is applied from the second control lines HS0 and HS1, which are wired in parallel to the word lines ROW00, ROW01, ROW10, and ROW11, to the memory cells M11, M12, M21, and M22 through the switching mechanisms 36a and 36b. Thus, at the data programming operation, the data reading operation, and the data erasing operation, positive voltages are applied to the first control line DL0, and no negative voltages need to be applied.

With this configuration, in the non-volatile semiconductor memory device 51, for example, when a larger number of the memory cells M11, M12, M31, M32, . . . are disposed in the memory well MPW0, and the number of the first control lines DL0, DL1, . . . is increased accordingly, only positive voltages are applied to the first control lines DL0, DL1, . . . . Thus, a power circuit configured to apply voltage to the first control lines DL0, DL1, . . . can be simplified, and hence the formation area of the power circuit can be reduced.

In addition, in the non-volatile semiconductor memory device 51, the element isolation layer IL electrically insulates the wells MNW0 and MNW1 surrounding the memory wells MPW0 and MPW1 from the well NW0 surrounding the switching mechanism formation well PW0. Thus, for example, when data is erased from the erasing memory cells M11, M12, M31, and M32, a voltage of 4 V is applied to the well MNW0 and the well MNW1 surrounding the memory well MPW0 in accordance with the voltage of 4 V applied to the memory well MPW0 in which the erasing memory cells M11, M12, M31, and M32 are disposed, a voltage of 0 V, which is different from the voltage applied to the wells MNW0 and MNW1 surrounding the memory wells MPW0 and MPW1, can be applied to the well NW0 surrounding the switching mechanism formation well PW0.

Accordingly, in the non-volatile semiconductor memory device 51, a voltage difference of 3 V approximately occurs between the switching mechanism formation well PW0 to which the voltage of −3 V is applied and the well NW0 at 0 V surrounding the switching mechanism formation well PW0 at the data erasing operation. Thus, voltages applied to the P-type MOS transistors 37 of the switching mechanisms 36a, 36b, 36c, and 36d can be reduced as compared to the non-volatile semiconductor memory device 31 according to the second embodiment described above.

As a result, in the non-volatile semiconductor memory device 51, voltages applied to the switching mechanisms 36a, 36b, 36c, and 36d can be reduced to a voltage difference of 3 V at the data erasing operation as well as the data programming operation and the data reading operation. Thus, an insulating film having a thickness equal to or smaller than 5 nm can be disposed on a channel region in each of the P-type MOS transistors 37 and the N-type MOS transistor 38 of the switching mechanisms 36a, 36b, 36c, and 36d.

Thus, in the non-volatile semiconductor memory device 51, a dedicated MOS transistor having a high breakdown-voltage structure such as an offset structure is not required for a diffusion layer of each MOS transistor included in a switching mechanism. Instead, a MOS transistor used for normal input/output (I/O) at 2.5 V may be used to form each of the switching mechanisms 36a, 36b, 36c, and 36d.

With the above-described configuration, while voltage from the second control line HS0 is applied, as a memory gate voltage, to the sub control line W11 through the switching mechanism 36a, the switching mechanism 36b can block voltage application to the corresponding sub control line W12. Thus, while the memory cells M11, M12, M21, and M22 are arranged in one direction along the first control line DL0, the switching mechanism 36b can prevent application of the memory gate voltage to the memory cells M21 and M22, thereby reducing the occurrence of disturbance accordingly. The sub control line W11 to which the memory gate voltage is applied from the second control line HS0 are used as the gates of the memory transistors F11 and F12, and thus the sub control line W11 and the gates are disposed in a single wiring layer, thereby achieving downsizing as compared to a case in which the sub control line W11 and the gates are disposed in separate wiring layers.

(5) Other Embodiments

In the above-described embodiment, memory cells are the memory cells M11 and M31 including the switch circuits S11 and S31 each having a bipolar MOS transistor configuration in which the P-type memory well MPW, the N-type diffusion layer 16, and the P-type memory well MPW are stacked in this order from the deep well DNW between the sidewalls 12 of the memory transistors F11 and F31 adjacent to each other as illustrated in FIG. 2. However, the present invention is not limited thereto. Memory cells having various kinds of other configurations are applicable.

Figure 16:
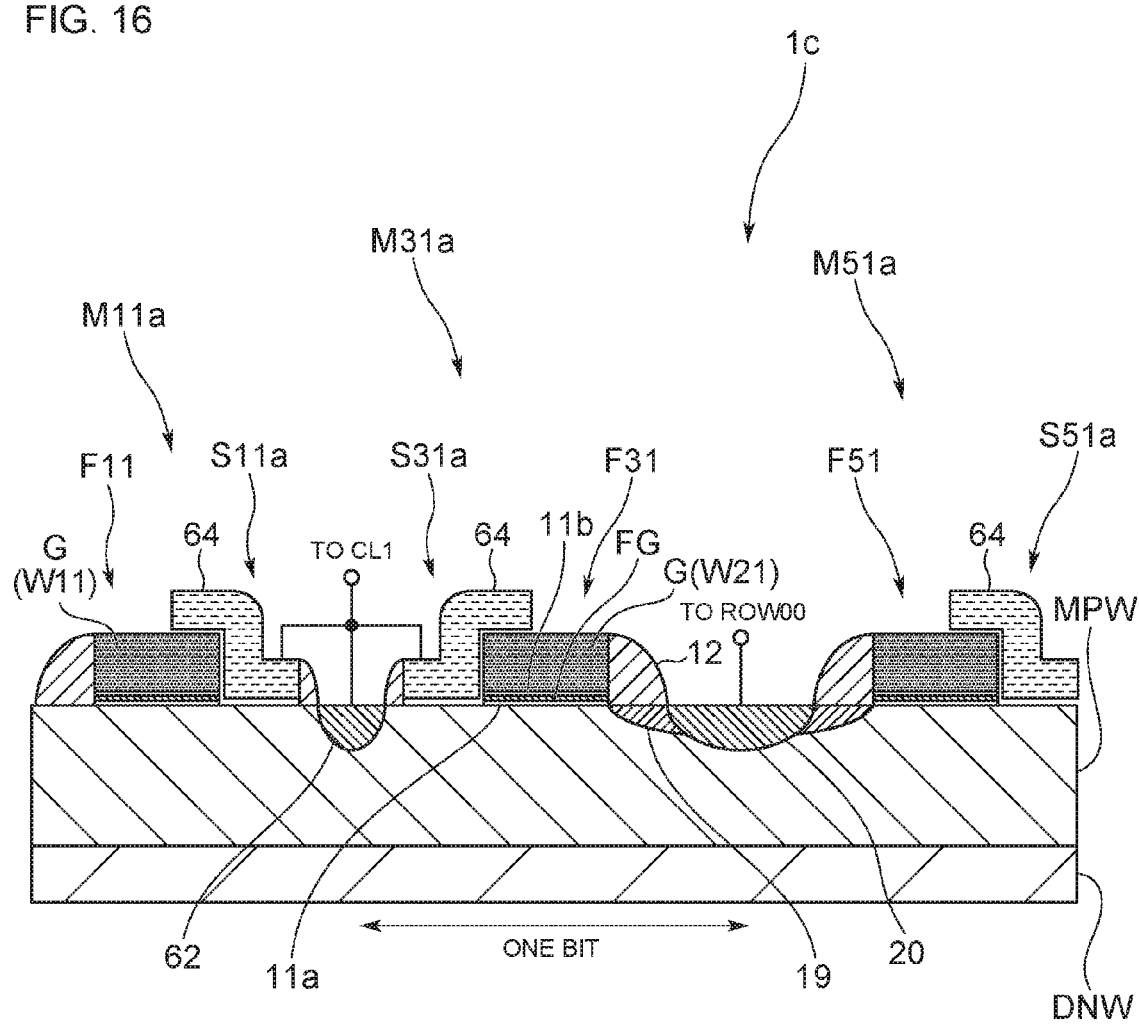
FIG. 16 is a schematic view illustrating a sectional configuration of a plurality of memory cells according to another embodiment.

For example, FIG. 16, in which any corresponding part to that in FIG. 2 is denoted by an identical reference sign, illustrates memory cells M11a, M31a, and M51a according to another embodiment. The memory cells M11a, M31a, and M51a all have identical structures and each include the memory transistors F11, F31, and F51 and switch circuits S11a, S31a, and S51a. A non-volatile semiconductor memory device 1c including the memory cells M11a, M31a, and M51a differs from the non-volatile semiconductor memory device 1a illustrated in FIG. 2 in the configurations of the switch circuits S11a, S31a, and S51a. Thus, the following mainly describes the configurations of the switch circuits S11a, S31a, and S51a.

In the non-volatile semiconductor memory device 1c including the memory cells M11a, M31a, and M51a, the switch circuit S11a of the memory cell M11a and the switch circuit S31a of the memory cell M31a are disposed between the memory transistor F11 of the memory cell M11a and the memory transistor F31 of the memory cell M31a disposed next to the memory cell M11a.

A diffusion layer 62 is formed in the surface of the memory well MPW between the memory transistor F11 of the memory cell M11a and the memory transistor F31 of the memory cell M31a disposed next to the memory cell M11a. The memory cells M11a and M31a are symmetrically disposed with respect to the diffusion layer 62.

In this case, a switch gate 64 of the switch circuit S11a is disposed, through an insulating layer, on the surface of the memory well MPW between the sub control line W11 serving as a gate G of the memory transistor F11 and the diffusion layer 62. Another switch gate 64 of the switch circuit S31a is disposed, through an insulating layer, on the surface of the memory well MPW between the sub control line W21 serving as a gate G of the memory transistor F31 and the diffusion layer 62.

For example, the switch gate 64 of the switch circuit S31a is disposed on a side surface of the sub control line W21 as the gate G of the memory transistor F31 and partially on an upper part thereof. The switch gate 64 of the switch circuit S31a is connected with the bit line CL1 connected with the switch gate 64 of the switch circuit S11a and the diffusion layer 62 to receive application of voltage same as those at the switch gate 64 of the switch circuit S11a and the diffusion layer 62. The same effect as that achieved by the non-volatile semiconductor memory device 1b illustrated in FIG. 2 described above can be achieved with the memory cells M11a, M31a, and M51a provided with the switch circuits S11a, S31a, and S51a each having such a configuration.

In the above-described embodiments, a state in which charge is stored in the charge storage layer is referred to as a data programmed state, and a state in which no charge is stored in the charge storage layer is referred to as a data erased state. However, the present invention is not limited thereto. The state in which no charge is stored in the charge storage layer may be referred to as the data programmed state, and the state in which charge is stored in the charge storage layer may be referred to as the data erased state.

In the above-described embodiments, the sub control lines W11, W12, W21, and W22 are made of polysilicon, and polysilicon transistors having gates made of polysilicon are provided as the memory transistors F11, F12, F21, F22, F31, F32, F41, and F42. However, the present invention is not limited thereto. For example, the sub control lines W11, W12, W21, and W22 may be made of metallic material such as tungsten silicide (WxSiy), nickel silicide (NixSiy), or tantalum (Ta) so that the memory transistors F11, F12, F21, F22, F31, F32, F41, and F42 having gates made of the metallic material are provided.

In the first embodiment described above, the switching transistors 26a, 26b, 26c, and 26d having MOS transistor structures are provided as switching mechanisms at intersections between the first control lines DL0 and DL1 to which a memory gate voltage is applied and the second control lines HS0 and HS1 to which a switching gate voltage is applied. However, the present invention is not limited thereto. Switching transistors having MOS transistor structures may be provided as switching mechanisms at the intersections between the first control lines DL0 and DL1 to which a switching gate voltage is applied and the second control lines HS0 and HS1 to which a memory gate voltage is applied.

In the second and third embodiments described above, the switching mechanisms 36a, 36b, 36c, and 36d having CMOS structures are provided at intersections between the first control lines DL0 and DL1 to which a switching gate voltage is applied and the second control lines HS0 and HS1 including the first memory gate lines HS0a and HS1a and the second memory gate lines HS0b and HS1b, respectively, to which a memory gate voltage is applied. However, the present invention is not limited thereto. A switching mechanism having a CMOS structures may be provided at each intersection between a first control line including a first memory gate line and a second memory gate line to which a memory gate voltage is applied and a second control line to which a switching gate voltage is applied.

The conductivity types of N type and P type in the above-described embodiments may be interchanged. In addition, the number of the memory units 2a, 2b, 2c, and 2d and the number of the memory cells M11 and M12 provided in a single memory unit 2a may be any numbers. In addition, any voltage other than voltages having voltage values exemplarily illustrated in the first to third embodiments described above may be applied.

The above-described embodiments specifically describe a memory cell in which the memory transistor F11 and the like each have a data erased state of a depletion type. However, the present invention is not limited thereto. A memory cell in which the memory transistor F11 and the like may have a data erased state of an enhancement type is applicable. Alternatively, the present invention is applicable to a non-volatile semiconductor memory device in which the direction of voltage application is inverted between data programming and data erasing with respect to that in the above-described embodiments (non-volatile semiconductor memory device having an inverted threshold relation between data programming and data erasing).

REFERENCE SIGNS LIST 1a, 1b, 1c, 25, 31, 51 non-volatile semiconductor memory device
2a, 2b, 2c, 2d memory unit
DL0, DL1, DL3 first control line
HS0, HS1 second control line
first memory gate line (second control line)
second memory gate line (second control line)
W11, W12, W21, W22 sub control line
26a, 26b, 26c, 26d switching transistor (switching mechanism)
6a, 6b, 6c, 6d, 36a, 36b, 36c, 36d switching mechanism
M11, M12, M21, M22, M31, M32, M41, M42, M11a, M31a, M51a memory cell
F11, F12, F21, F22, F31, F32, F41, F42 memory transistor
S11, S12, S21, S22, S31, S32, S41, S42, S11a, S31a, S51a switch circuit
ST11, ST12, ST21, ST22, ST31, ST32, ST41, ST42 switch transistor (switch circuit)

The invention claimed is:
1. A non-volatile semiconductor memory device comprising:
a first control line;
a pair of second control lines intersecting with the first control line;
a first switching mechanism connected with the first control line and with a first one of the pair of second control lines;
a second switching mechanism connected with the first control line and with a second one of the pair of second control lines;
a first sub control line connected with the first switching mechanism;
a second sub control line connected with the second switching mechanism;
a plurality of first memory cells connected with the first sub control line, each of the plurality of first memory cells having a first switch circuit and a first memory transistor connected with the first switch circuit, the first memory transistor having a first charge storage layer to represent a data programming state depending on a state of charge storage in the first charge storage layer;
a plurality of second memory cells connected with the second sub control line, each of the plurality of second memory cells having a second switch circuit and a second memory transistor connected with the second switch circuit, the second memory transistor having a second charge storage layer to represent a data programming state depending on a state of charge storage in the second charge storage layer;
a first word line connected with a source of the first memory transistor;
a second word line connected with a source of the second memory transistor;
a first memory well wire connected with the first switch circuit; and
a second memory well wire connected with the second switch circuit, wherein:
the first sub control line is disposed facing to the first charge storage layer of the first memory transistor and is provided as a gate of the first memory transistor,
the second sub control line is disposed facing to the second charge storage layer of the second memory transistor and is provided as a gate of the second memory transistor,
when data is programmed into a memory cell of the plurality of first memory cells and no data is programmed into the plurality of second memory cells:
a first voltage is applied to the first control line;
a second voltage is applied to the first one of the pair of second control lines;
one of the first voltage and the second voltage is applied, as a memory gate voltage, to the first sub control line through the first switching mechanism;
a third voltage is applied to the first memory well wire and to the source of the first memory transistor of the memory cell through the first word line, thereby programming the data into the first memory transistor based on a difference between the third voltage and the memory gate voltage; and
voltage application from the first control line or the second one of the pair of second control lines to the second sub control line is blocked by the second switching mechanism.
2. The non-volatile semiconductor memory device according to claim 1, wherein
the plurality of first memory cells and the plurality of second memory cells are arranged along the first control line and share a bit line to which a precharge voltage for reading out whether data is programmed into each of the plurality of first memory cells and the plurality of second memory cells is applied, a drain of the first memory transistor is connected with the bit line through the first switch circuit, and a drain of the second memory transistor is connected with the bit line through the second switch circuit.

3. The non-volatile semiconductor memory device according to claim 2, wherein the first switch circuit has a bipolar transistor structure having a base connected with the drain of the first memory transistor, and having an emitter connected with the bit line, and the second switch circuit has a bipolar transistor structure having a base connected with the drain of the second memory transistor, and having an emitter connected with the bit line.

4. The non-volatile semiconductor memory device according to claim 1, wherein, at the time of reading out whether data is programmed into any of the plurality of first memory cells and the plurality of second memory cells, the first switching mechanism and the second switching mechanism are all turned on or off to have identical states of electrical connection with the first and second sub control lines corresponding to the first and second switching mechanisms, respectively.

5. The non-volatile semiconductor memory device according claim 1, wherein the memory gate voltage is configured to be applied to the first control line, a switching gate voltage for turning on and off the first switching mechanism is configured to be applied to the first one of the pair of second control lines, and a switching gate voltage for turning on and off the second switching mechanism is configured to be applied to the second one of the pair of second control lines.

6. The non-volatile semiconductor memory device according to claim 1, wherein a switching gate voltage for turning on and off each of the first switching mechanism and the second switching mechanism is configured to be applied to the first control line, the memory gate voltage is configured to be applied to each of the pair of second control lines.

7. The non-volatile semiconductor memory device according to claim 1, wherein each of the first switching mechanism and the second switching mechanism is a switching transistor having a MOS transistor structure.

8. The non-volatile semiconductor memory device according to claim 6, wherein each of the pair of second control lines includes a first memory gate line and a second memory gate line, and each of the first switching mechanism and the second switching mechanism has a CMOS structure in which one end of a P-type MOS transistor is connected with one end of an N-type MOS transistor, the first memory gate line is connected with the other end of the P-type MOS transistor, the second memory gate line is connected with the other end of the N-type MOS transistor, and each of the first sub control line and the second sub control line is connected with the one end of the P-type MOS transistor and the one end of the N-type MOS transistor.

9. The non-volatile semiconductor memory device according to claim 8, further comprising:

a memory well of a conductivity type of N type or P type in which each of the plurality of first memory cells and the plurality of second memory cells is disposed;

a switching mechanism formation well of a conductivity type same as the conductivity type of the memory well; and a separating well separating the memory well from the switching mechanism formation well, the separating well being of a conductivity type different from the conductivity types of the memory well and the switching mechanism formation well, wherein, in each of the first switching mechanism and the second switching mechanism, one of the P-type MOS transistor and the N-type MOS transistor is disposed in the switching mechanism formation well, and the other of the N-type MOS transistor and the P-type MOS transistor is disposed in the separating well.

10. The non-volatile semiconductor memory device according to claim 9, further comprising an element isolation layer electrically insulating a region of the separating well around the memory well from a region of the separating well in which the N-type MOS transistor or the P-type MOS transistor is disposed.

* * * * *